United States Patent [19]
Sugiura et al.

[11] Patent Number: 6,150,686
[45] Date of Patent: Nov. 21, 2000

[54] SEMICONDUCTOR INTEGRATED CIRCUIT DEVICE WITH TRENCH CAPACITOR AND METHOD OF MANUFACTURING THE SAME

[75] Inventors: Soichi Sugiura, Yokkaichi; Shigeki Sugimoto, Yokohama, both of Japan

[73] Assignee: Kabushiki Kaisha Toshiba, Kawasaki, Japan

[21] Appl. No.: 09/063,779

[22] Filed: Apr. 22, 1998

[30] Foreign Application Priority Data

Apr. 23, 1997 [JP] Japan ..................................... 9-105947

[51] Int. Cl.⁷ ................................................. H01L 27/108
[52] U.S. Cl. ............................................ 257/301; 257/313
[58] Field of Search ..................................... 257/301, 313

[56] References Cited

U.S. PATENT DOCUMENTS 5,793,075  8/1998  Alsmeier et al. ....................... 257/296

OTHER PUBLICATIONS

L. Nesbit et al., "A 0.6 $\mu m^2$ 256Mb Trench DRAM Cell With Self–Aligned BuriEd Strap (Best)"; 1993; pp. 627–630, Dec. 1993.

Primary Examiner—Mark V. Prenty
Attorney, Agent, or Firm—Banner & Witcoff, Ltd.

[57] ABSTRACT

A semiconductor integrated circuit device includes a p-silicon substrate, an n-buried layer formed in the substrate to divide the substrate into an upper region and a lower region, a trench formed from the surface of the substrate to the lower region of the substrate through the buried layer, and an electrode formed in the trench. The electrode forms an n-inversion layer using the buried layer as a carrier source, in the lower region of the semiconductor substrate by a field effect. The n-inversion layer constitutes a capacitor together with the electrode.

16 Claims, 30 Drawing Sheets

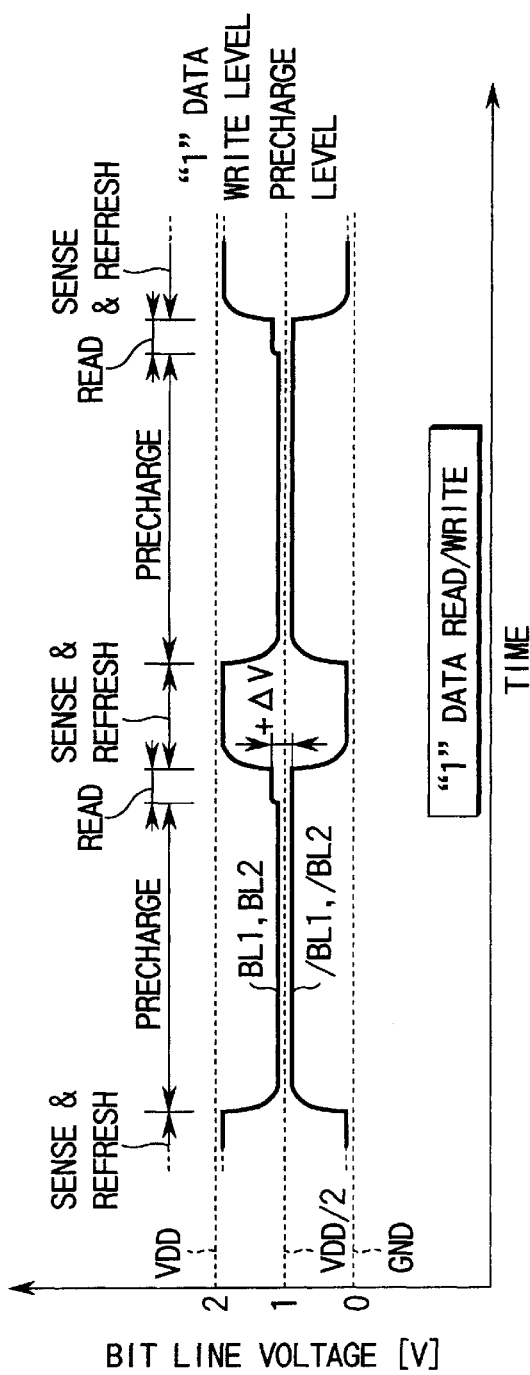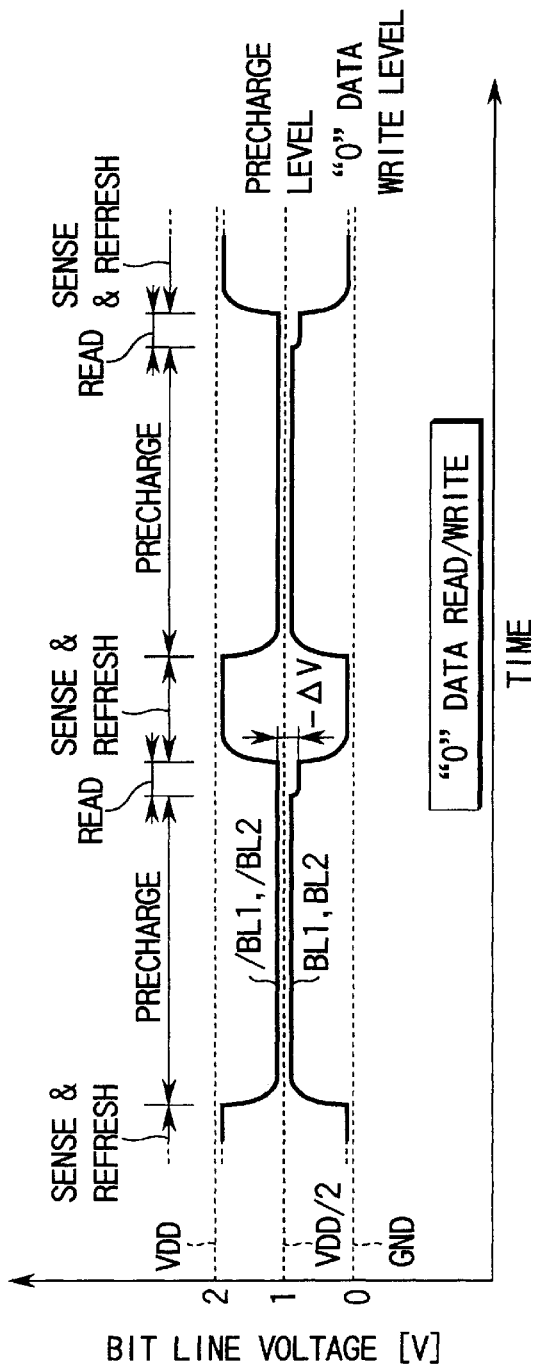
FIG. 9A
FIG. 9B

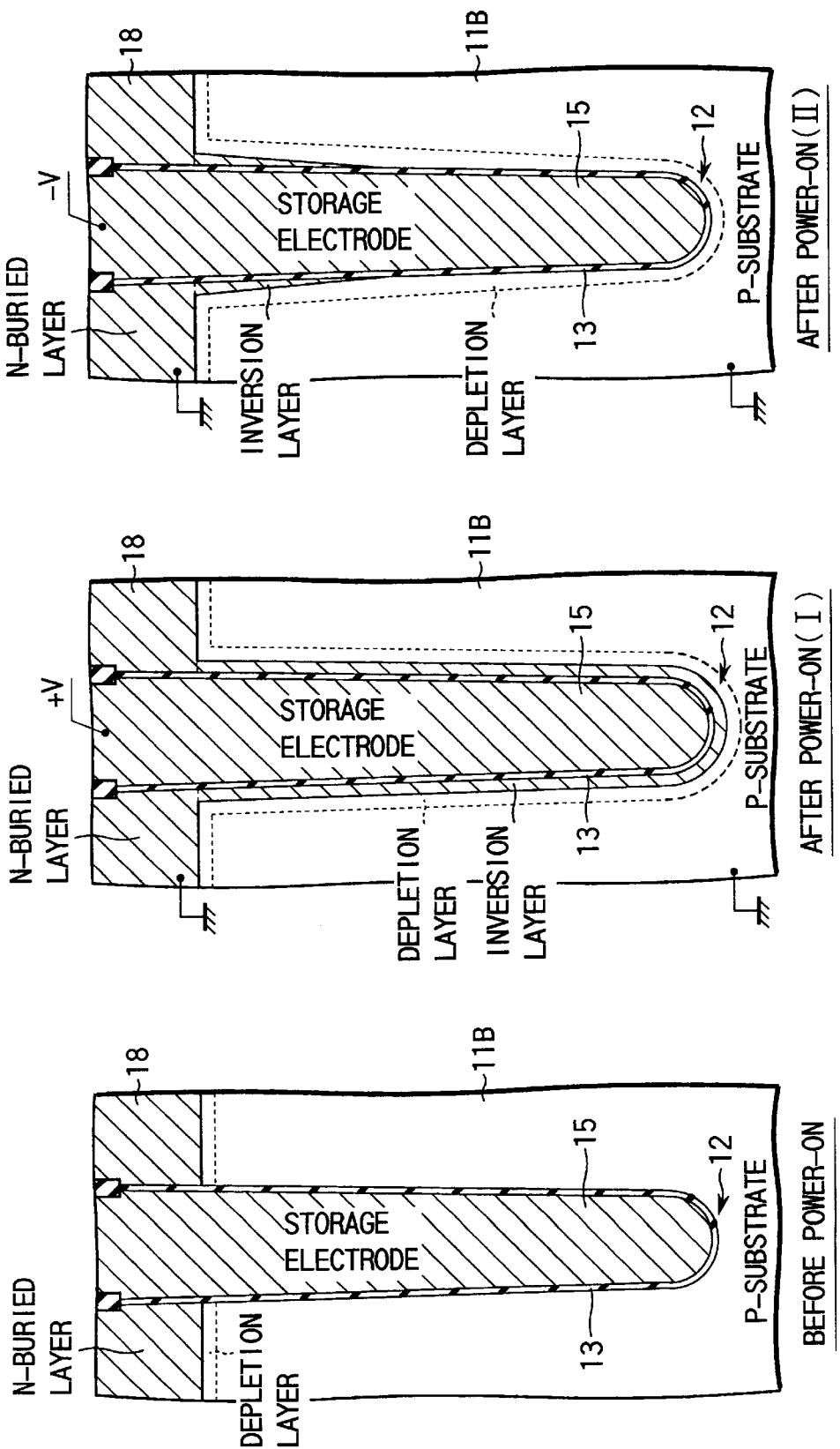

SEMICONDUCTOR INTEGRATED CIRCUIT DEVICE WITH TRENCH CAPACITOR AND METHOD OF MANUFACTURING THE SAME

BACKGROUND OF THE INVENTION

The present invention relates to a semiconductor integrated circuit device and, more particularly, to a dynamic semiconductor memory device using a trench capacitor as a capacitor element constituting a memory cell.

The memory cell of a dynamic semiconductor memory device (to be referred to as a DRAM hereinafter) is made up of a capacitor and a transfer insulated gate transistor. To increase the integration degree of the DRAM, capacitors with larger capacitance values are desirably formed in a smaller area. One means for realizing such a structure is a trench capacitor obtained by constituting a capacitor using a trench formed in a silicon substrate.

Of trench capacitors, a BEST (BuriEd STrap) cell receives a great deal of attention as a capacitor which can cope with a mass DRAM in the Gbit (Gigabit) class.

Such a BEST cell is described in the following references:

"International Electron Devices Meeting", 1993, pp. 627–630, and

"A 0.6 $\mu m^2$ 256 Mb Trench DRAM Cell With Self-Aligned BuriEd STrap (BEST)", L. Nesbit et al., Dec. 5–8, 1993.

The trench capacitor of the BEST cell is obtained by forming an n-buried well in a p-silicon substrate, forming a trench to reach the n-well, and forming a storage electrode in this trench. The n-buried well functions as a plate electrode.

The BEST cells can be micropatterned and are effective to increase the integration degree of memory cell arrays. However, since the plate electrode is formed by the n-buried well, a chip including circuits such as sense amplifiers formed around memory cell arrays is difficult to downsize.

The n-buried well is formed by heavily doping an n-impurity in a deep portion in the substrate, and thermally diffusing the doped n-impurity over a wide range in the substrate. The n-impurity diffuses in not only a direction perpendicular to the substrate but also a direction horizontal to the substrate. For this reason, the area of the n-buried well is large.

Forming the n-buried well requires a long-time thermal diffusion step, which poses problems such as high manufacturing cost in terms of mass production.

In consideration of these situations, a recent BEST cell is improved such that an n-impurity in solid phase is diffused from a trench into a substrate to form an n-diffusion layer around the trench, and this n-diffusion layer is used as a plate electrode.

FIG. 24 is a sectional view showing the element structure of one BEST cell of this type.

As shown in FIG. 24, a trench 142 is formed in a semiconductor substrate 141 made of p-silicon. An n⁺-diffusion region 143 heavily containing an n-impurity is formed in a portion of the semiconductor substrate 141 facing trench 142. The n⁺-diffusion region 143 serves as the plate electrode of the trench capacitor. A capacitor insulating film 144 made of, e.g., a silicon oxide film is formed on a surface inside the trench 142. A storage electrode 145 of the trench capacitor is formed to bury the trench 142 except for an upper portion of the trench 142. An n⁺-conductive layer 146 is buried in the upper portion of the trench.

A transfer transistor 147 and a thick field oxide film 148 are formed around the trench capacitor on the substrate 141. The transfer transistor 147 is formed by sequentially stacking a gate oxide film 149 and a gate electrode 150 on the substrate 141, and forming source and drain regions 151 and 152 each made of an n-diffusion region in the substrate surface region. The source region 151 is electrically connected to the n⁺-conductive layer 146 through part of the side wall of the trench 142.

The trench capacitor has the electrode 145 formed inside the trench through the capacitor insulating film 144 formed on the surface inside the trench 142, and the heavily doped n⁺-diffusion region 143 which is formed in the portion of the semiconductor substrate 141 facing the trench 142 and used as a counter electrode. A voltage ½ the voltage used inside the DRAM is applied across the counter electrode and the electrode formed inside the trench. In general, the capacitor insulating film 144 has a thickness as small as 10 nm or less, and the n⁺-diffusion region 143 has an impurity concentration as sufficiently high as $5 \times 10^{18}/cm^3$.

As the integration degree of the DRAM increases, the frontage of the trench becomes smaller. The capacitance value of the capacitor must be kept large by making the trench deeper. The n⁺-diffusion region 143 is formed by doping the n-impurity, forming the insulating film serving as a solid phase diffusion source in the trench, and diffusing the n-impurity in solid phase from the insulating film into the semiconductor substrate 141 through the side surface inside the trench. After that, the insulating film serving as the diffusion source is removed from the trench. In this case, if the trench is deep with a small frontage, i.e., the aspect ratio of the trench is high, the insulating film serving as the diffusion source is difficult to completely remove from the trench.

If the insulating film serving as the diffusion source is left on the bottom of the trench, i.e., the end portion of the trench, the trench becomes shallow. Accordingly, the trench capacitor cannot ensure a sufficient capacitance value, and data storage characteristics degrade.

Note that the aspect ratio of a current trench is almost 20 (depth of about 7 $\mu m$/frontage of about 0.3 $\mu m$). FIGS. 25A and 25B respectively show sections of a BEST cell having a trench with an aspect ratio of almost 20.

As shown in FIG. 25A, a frontage F of the opening portion of the trench 142 is about 0.3 $\mu m$, and a depth D thereof is about 7 $\mu m$. An aspect ratio D/F is as high as about 20. The trench 142 having such a high aspect ratio is tapered by current manufacturing techniques. The insulating film serving as the diffusion source is generally removed by dry etching. The frontage F of the opening portion of the trench 142 is large. For this reason, fresh unreacted etchant gas is sufficiently supplied from outside the trench 142, and the insulating film can be easily removed.

To the contrary, the width of the distal end portion of the trench 142 is small, and the etchant gas reaches the end portion of the trench while reacting with the insulating film inside the trench 142. For this reason, the amount of fresh unreacted etchant gas becomes smaller at the end portion than at the opening portion, and the etching effect for the insulating film becomes very poor.

From these situations, the insulating film is very difficult to completely remove from the trench 142.

Accordingly, an insulating film 160 serving as the solid phase source is left on the bottom of the trench 142, as shown in FIG. 25B. The insulating film 160 left on the bottom of the trench 142 decreases an effective depth D' of the trench 142 functioning as a trench capacitor T.C. to decrease the capacitance of the trench capacitor T.C. Although the insulating film 160 can be completely removed by etching the insulating film 160 for a long time, this leads to a long manufacturing time and high manufacturing cost.

The micropatterning of memory cells of the DRAM will advance to realize a memory capacitance in the Gbit class or higher. In the trench capacitor, a trench having an aspect ratio of 20 or higher will be formed. From these viewpoints, the insulating film 160 may become more difficult to remove.

BRIEF SUMMARY OF THE INVENTION

The present invention has been made in consideration of the above situations, and has as its object to provide a semiconductor integrated circuit device capable of maintaining a sufficiently large capacitance value of a capacitor element even for a high integration degree, and a method of manufacturing the same.

To achieve the above object, according to the present invention, there is provided a semiconductor integrated circuit device comprising a semiconductor substrate of a first conductivity type, a buried layer formed in the semiconductor substrate and spaced apart from a surface of the semiconductor substrate to divide the semiconductor substrate into an upper region and a lower region, a trench formed from the surface of the semiconductor substrate to the lower region through the buried layer, and an electrode formed in the trench and capacitively coupled to the lower region.

More specifically, in the present invention, the electrode formed in the trench is capacitively coupled to the lower region of the semiconductor substrate, and the inversion layer of the second conductivity type is formed in the lower region of the semiconductor substrate by the field effect. The inversion layer is used as one electrode of the capacitor.

According to the present invention, one electrode of the capacitor need not be formed by diffusing a conductive impurity of the second conductivity type from the trench to the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9A is a voltage waveform chart showing a change in bit line voltage upon a "1" data read/write;

FIG. 9B is a voltage waveform chart showing a change in bit line voltage upon a "0" data read/write;

FIG. 13A is a view showing the state of the trench capacitor before power-on;

FIG. 13B is a view showing a state (I) of the trench capacitor after power-on;

FIG. 13C is a view showing a state (II) of the trench capacitor after power-on;

DETAILED DESCRIPTION OF THE INVENTION

Figure 1:
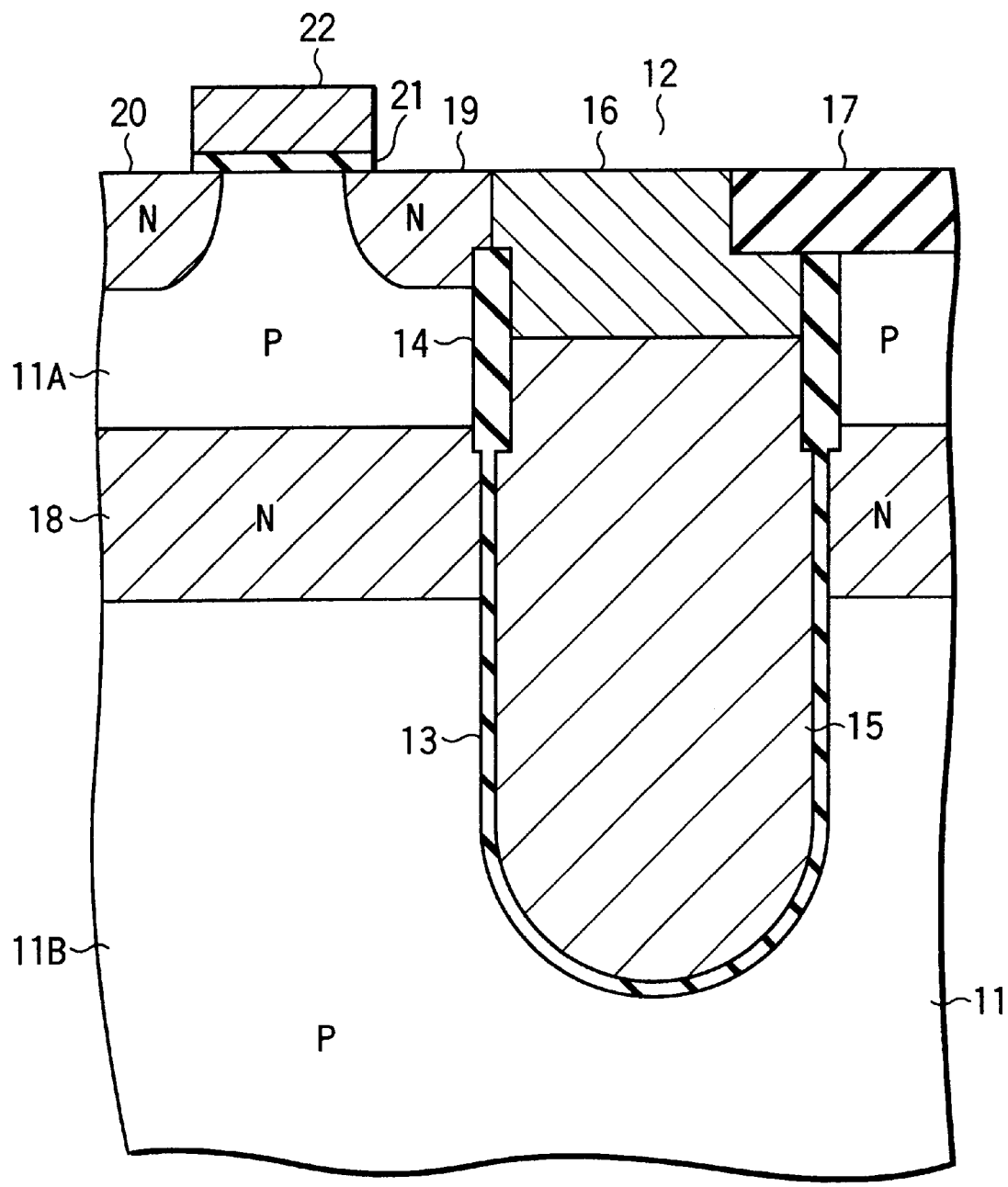
FIG. 1 is a sectional view of a dynamic memory cell according to the present invention.

Embodiments of the present invention will be described below with reference to the several views of the drawing. In this description, the same reference numerals denote the same parts throughout the drawing.

[First Embodiment]

Figure 2:
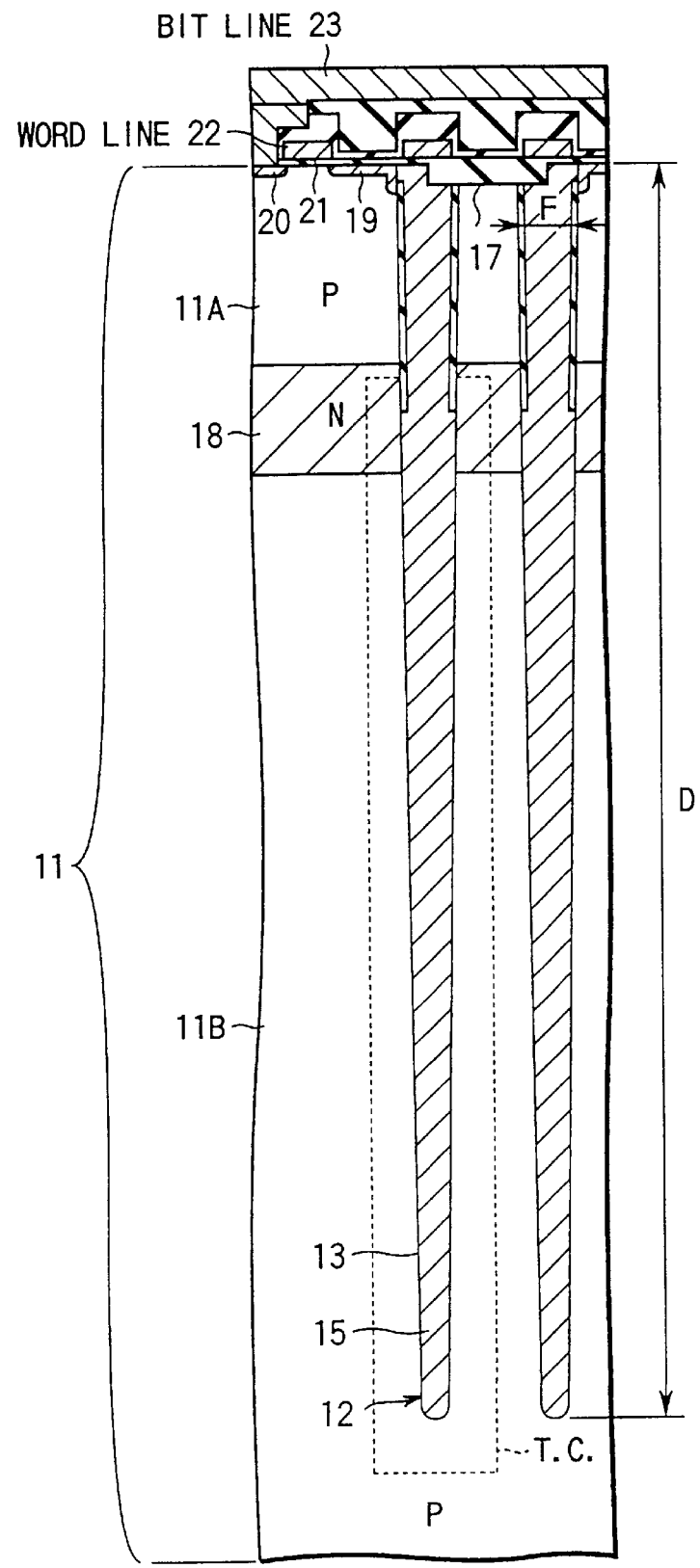
FIG. 2 is a sectional view showing the dynamic memory cell according to the present invention at an aspect ratio of about 20.

FIG. 1 is a sectional view schematically showing the element structure of one dynamic memory cell according to the first embodiment of the present invention. FIG. 2 is a sectional view showing the dynamic memory cell at an aspect ratio of about 20.

As shown in FIGS. 1 and 2, a trench 12 is formed in a semiconductor substrate 11 made of p-silicon. An aspect ratio D/F of the trench 12 is about 20 in the current 256 Mbit class, and is expected to exceed 20 in order to ensure the capacitance of the capacitor in the 1 Gbit class.

FIG. 2 shows the trench 12 whose aspect ratio D/F is about 20. A capacitor insulating film 13 made of a silicon oxide film with a thickness of, e.g., 10 nm is formed on a surface inside the trench 12 except for an upper portion. As the capacitor insulating film 13, an ONO film (three-layered insulating film made of a silicon oxide film, a silicon nitride film, and a silicon oxide film), or an ON film (two-layered insulating film made of a silicon oxide film and a silicon nitride film) is available in addition to the silicon oxide film. A silicon oxide film (collar oxide film) 14 having a thickness much larger than that of the capacitor insulating film 13, e.g., a thickness of 30 to 40 nm is formed above the capacitor insulating film 13 on the surface inside the trench 12 except for an upper portion. An electrode 15 made of, e.g., a polysilicon layer whose resistance is decreased by doping an n-impurity is formed in the trench 12 so as to bury the trench up to an intermediate portion. As the electrode 15, an amorphous silicon layer is also available in addition to the polysilicon layer. A conductive layer 16 made of, e.g., a polysilicon layer whose resistance is decreased by doping an n-impurity is formed on the electrode 15 inside the trench 12. An element isolation field insulating film 17 is formed in the surface region of the substrate 11 including part of the conductive layer 16. In FIG. 2, the conductive layer 16 is integrated with the electrode 15, and they are illustrated as one member.

A plate-like n-buried layer 18 is buried in a portion of the substrate apart from the surface of the substrate 11. The n-buried layer 18 has a predetermined width in the direction of depth, and the distance from the surface of the substrate 11 to the upper surface of the n-buried layer 18 is set to 0.5 $\mu$m or more. The n-buried layer 18 is formed such that its upper surface is located at a shallower level than the lower portion of the thick silicon oxide film 14. An n-impurity, e.g., phosphorous (P) is doped in the n-buried layer 18. By doping the n-impurity, the sheet resistance of the n-buried layer 18 is decreased to 1,000Ω or less. The substrate 11 is electrically divided into an upper region 11A and a lower region 11B by the plate-like n-buried layer 18.

N-source and drain regions 19 and 20 of a selection transistor connected to the capacitor of the memory cell are formed in the major surface region of the upper region 11A of the substrate 11. The source region 19 is electrically connected to the conductive layer 16 through the side wall portion of the trench 12, whereas the drain region 20 is connected to a bit line (not shown).

A gate oxide film 21 and a gate electrode (word line) 22 are stacked on the substrate between the source and drain regions.

More specifically, in the DRAM cell having this structure, a capacitor is formed inside the trench 12 formed in the substrate 11, and the electrode 15 is connected to the source region 19 of the insulated gate transistor through the conductive layer 16 functioning as a buried strap. The capacitor is shaped like a test tube stuck into the plate-like n-buried layer 18.

An example of a concrete arrangement in which dynamic memory cells according to the present invention are integrated on a DRAM chip will be explained. As an example of the concrete arrangement, a 256 Mbit (Megabit) DRAM is exemplified.

Figure 3:
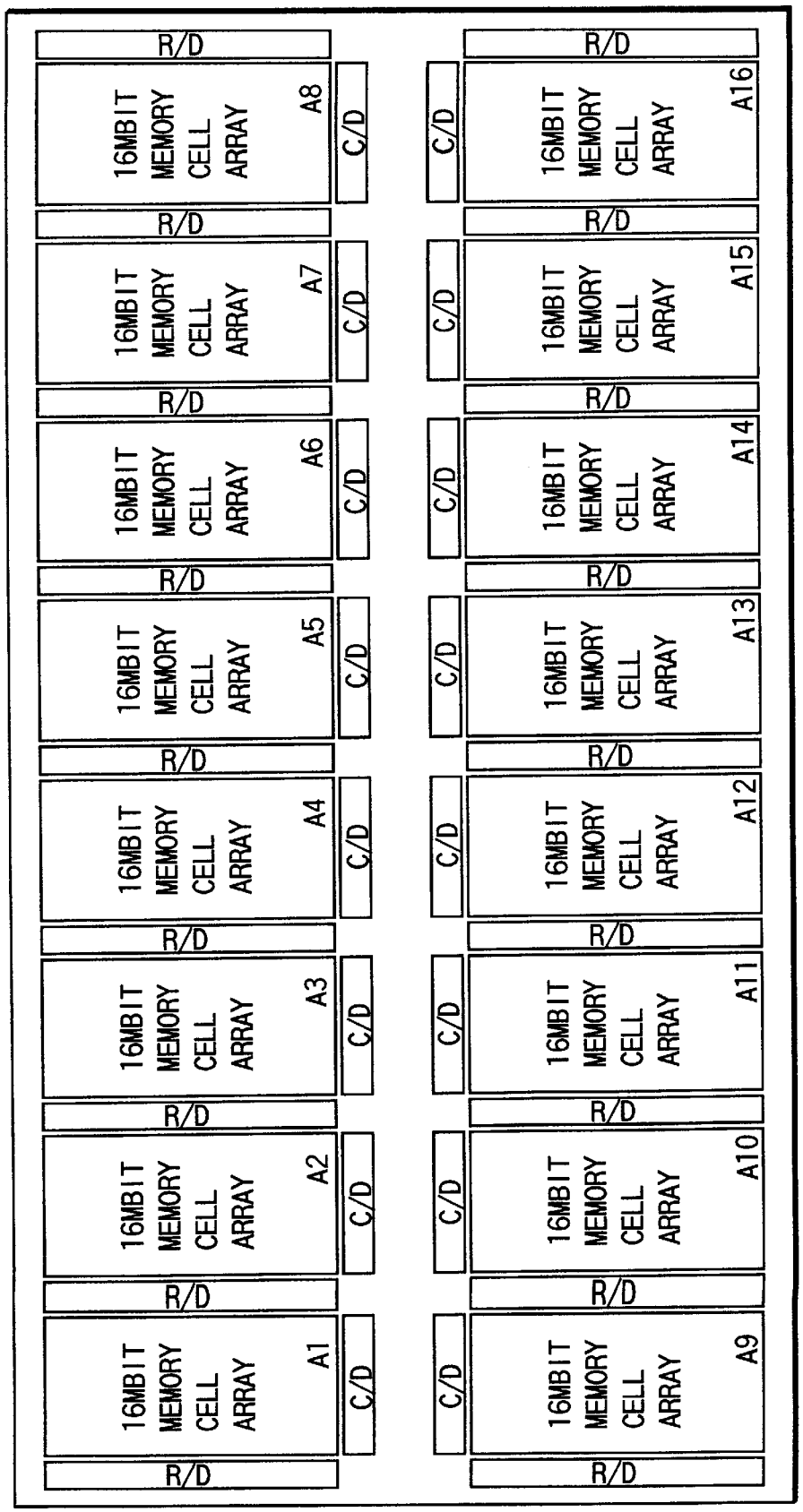
FIG. 3 is a plan view of a 256 Mbit DRAM chip using dynamic memory cells according to the present invention.

FIG. 3 is a plan view of a 256 Mbit DRAM chip using dynamic memory cells according to the present invention.

As shown in FIG. 3, the 256 Mbit DRAM is constituted by, e.g., 16 Mbit memory cell arrays A1 to A16. In FIG. 3, reference symbol "R/D" denotes a row decoder; and "C/D", a column decoder.

Figure 4:
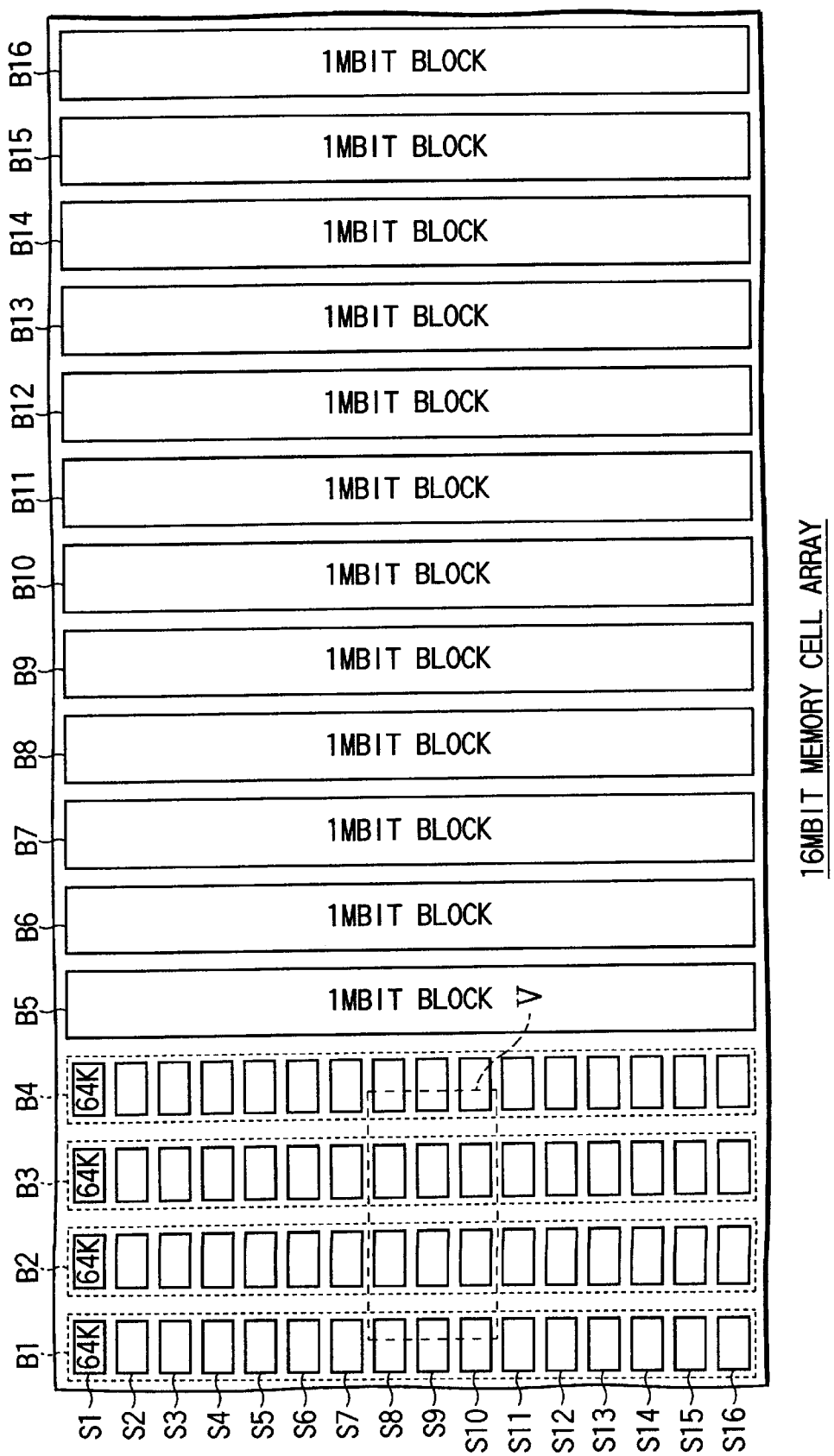
FIG. 4 is a plan view of a 16 Mbit memory cell array shown in FIG. 3.

FIG. 4 is a plan view of the 16 Mbit memory cell array shown in FIG. 3.

As shown in FIG. 4, each 16 Mbit memory cell array is constituted by 16 1 Mbit blocks B1 to B16. Each of the 1 Mbit blocks B1 to B16 is made up of 16 64 kbit segments S1 to S16. That is, the 16 Mbit memory cell array is constituted by integrating 256 pieces of 64 kbit (kilobit) segment.

Note that the 64 kbit segment is one type of memory cell array. At present, in a very-large-scale DRAM like the one having a capacity exceeding 256 Mbits, a large number of small-scale memory cell arrays like 64 kbit segments are integrated to constitute a larger-scale memory cell array.

Figure 5:
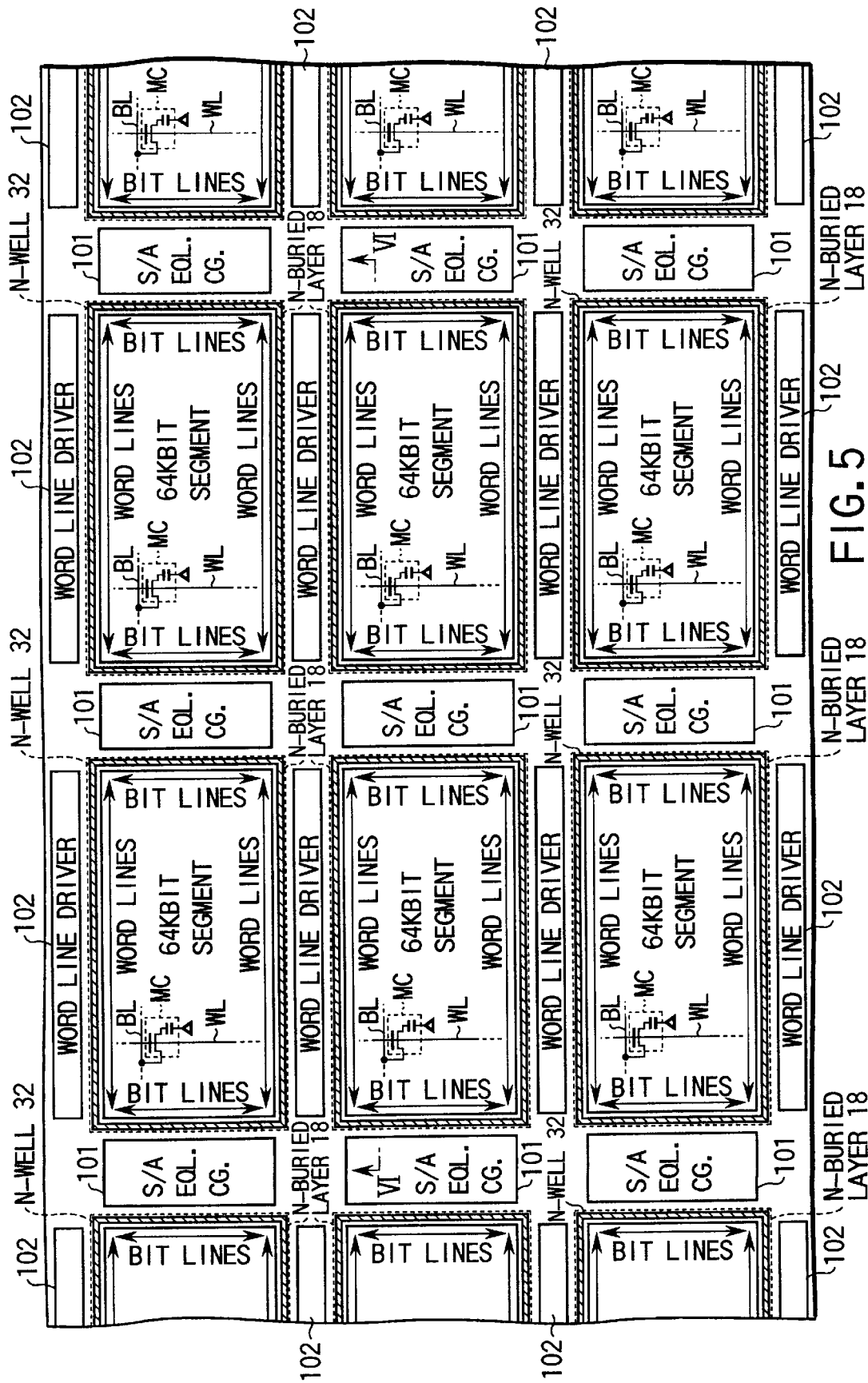
FIG. 5 is an enlarged view of a broken-line frame V shown in FIG. 4.

FIG. 5 is an enlarged view of a broken-line frame V shown in FIG. 4.

As shown in FIG. 5, each 64 kbit segment is surrounded by a bit line system circuit 101 such as a bit line sense amplifier and a word line system circuit 102 such as a word line driver. In FIG. 5,. reference symbol "S/A" denotes a bit line sense amplifier; "EQL.", a bit line equalizer; and "CG", a column gate.

Figure 6:
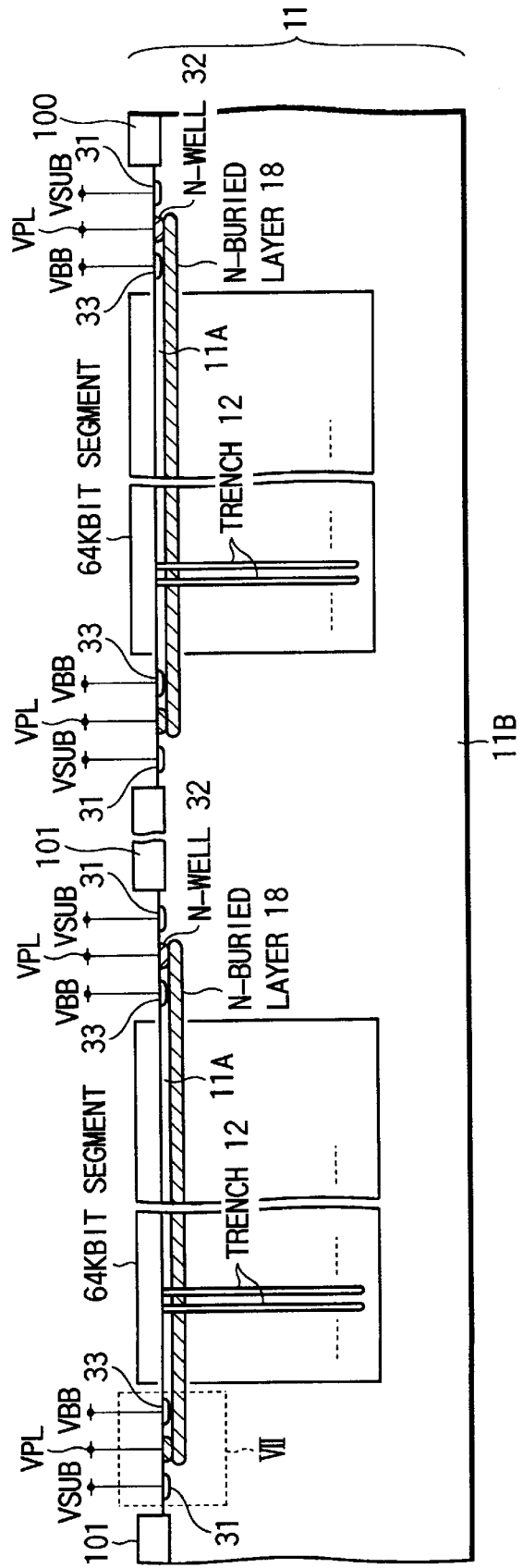
FIG. 6 is a sectional view taken along the line VI—VI shown in FIG. 5.

FIG. 6 is a sectional view taken along the line VI—VI shown in FIG. 5.

As shown in FIG. 6, the n-buried layer 18 is formed below each 64 kbit segment. In the substrate 11, the n-buried layer 18 is formed every 64 kbit segment. In other words, one 16

Mbit memory cell array comprises 256 n-buried layers 18. The whole 256 Mbit DRAM chip shown in FIG. 3 comprises 4,096 pieces of n-buried layer 18. N$^+$-wells 32 are formed in the substrate 11. Each n$^+$-well 32 extends from the surface of the substrate 11 to a corresponding n-buried layer 18. The n$^+$-well 32 has a ring-like shape, as shown in the plan view of FIG. 5. The ring-like n$^+$-well 32 divides the substrate 11 into the upper region 11A and the lower region 11B together with the n-buried layer 18. The trench 12 extends through the n-buried layer 18 from the upper region 11A to reach the lower region 11B.

Figure 7:
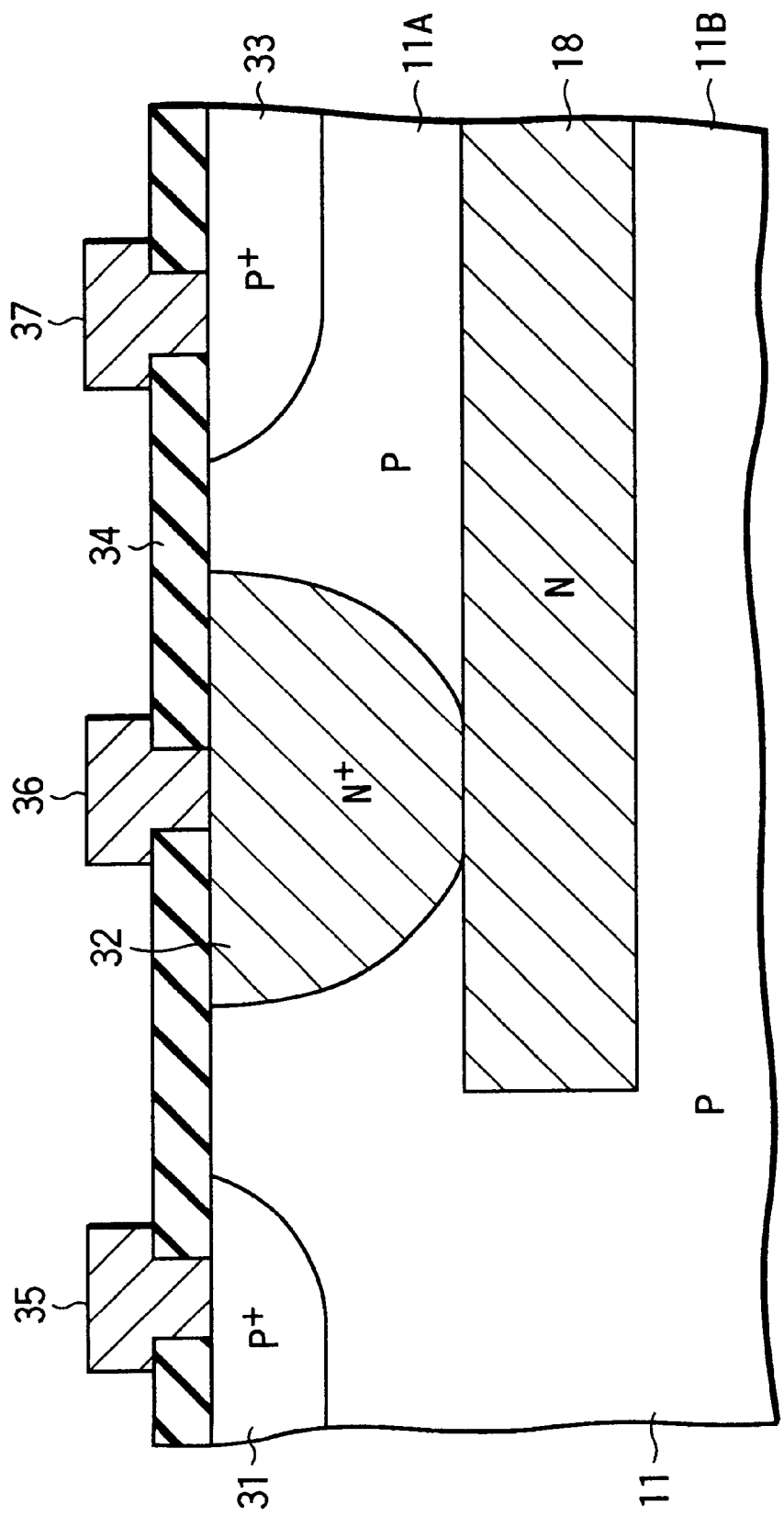
FIG. 7 is an enlarged view of a broken-line frame VII shown in FIG. 6.

FIG. 7 is an enlarged view of a broken-line frame VII shown in FIG. 6.

As shown in FIG. 7, a p$^+$-diffusion layer 31 is formed in the substrate 11. A wiring layer 35 is electrically connected to the p$^+$-diffusion layer 31. A substrate potential VSUB is applied to the wiring layer 35. The substrate potential VSUB is applied from the wiring layer 35 to the substrate 11 through the p$^+$-diffusion layer 31. An example of the substrate potential VSUB is a ground potential VSS inside the circuit, i.e., 0V. The substrate potential VSUB is also transmitted to the lower region 11B.

A wiring layer 36 is electrically connected to the n$^+$-well 32. A plate potential VPL is applied to the wiring layer 36. The plate potential VPL is applied from the wiring layer 36 to the n-buried layer 18 through the n$^+$-well 32. The plate potential VPL in the first embodiment is the internal ground potential VSS, i.e., 0V, similar to the substrate potential VSUB.

A p$^+$-diffusion layer 33 is formed in the substrate 11. A wiring layer 37 is electrically connected to the p$^+$-diffusion layer 33. A backgate bias potential VBB of the transfer transistor is applied to the wiring layer 37. The backgate bias potential VBB is applied from the wiring layer 37 to the upper region 11A through the p$^+$-diffusion layer 33. An example of the backgate bias potential VBB is a negative potential, e.g., −0.5V. The upper region 11A is at this negative potential in operating the DRAM. The backgate bias potential VBB of the transfer transistor is set negative in order to suppress subthreshold leakage of the transfer transistor and prevent degradation in data retention characteristics of the trench capacitor. Since the upper region 11A is separated from the lower region 11B by the n-buried layer 18 and the n$^+$-well 32, only the backgate region of the transfer transistor has the backgate bias potential VBB.

In FIG. 7, reference numeral 34 denotes an interlevel insulating film. The interlevel insulating film has an opening portion for connecting the wiring layer 35 to the p$^+$-diffusion layer 31, an opening portion for connecting the wiring layer 36 to the n$^+$-well 32, and an opening portion for connecting the wiring layer 37 to the p$^+$-diffusion layer 33.

In the DRAM in which the dynamic memory cells according to the present invention are integrated, the n-buried layer 18 is formed every memory cell array. Although the 64 kbit segment is exemplified as a memory cell array, the memory cell array is not limited to this as far as it is surrounded by other circuits.

[Operation]

An example of the basic operation of the DRAM in which the dynamic memory cells according to the present invention are integrated will be described below. The example of the basic operation will be explained by giving attention to a change in bit line voltage upon a read/write.

Figure 8:
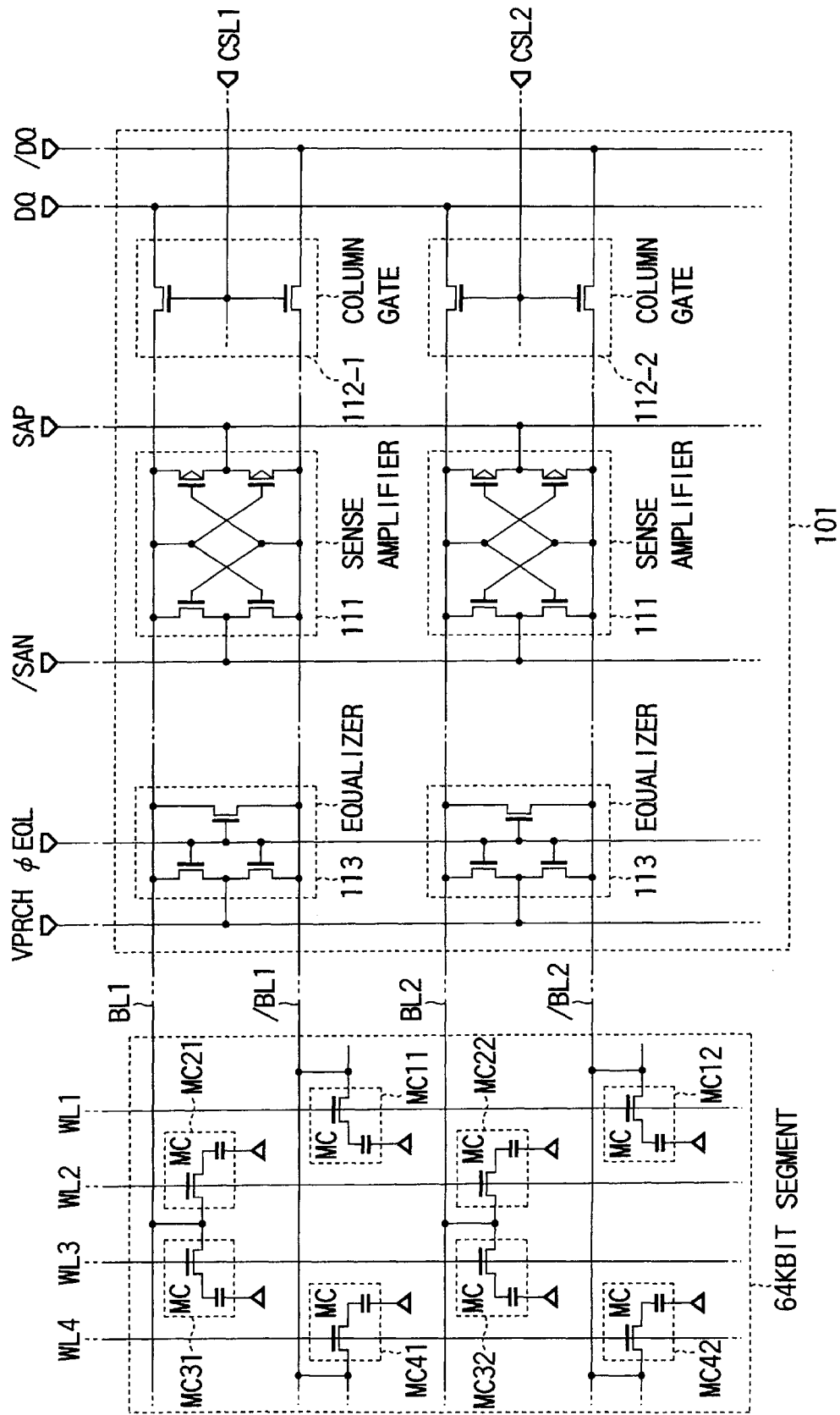
FIG. 8 is a circuit diagram of a 64 kbit segment and a bit line system circuit.

FIG. 8 is a circuit diagram of the 64 kbit segment and the bit line system circuit. FIG. 9A is a voltage waveform chart showing a change in bit line voltage upon a "1" data read/write. FIG. 9B is a voltage waveform chart showing a change in bit line voltage upon a "0" data read/write.

In operating the DRAM comprising the dynamic memory cells according to the present invention, the same potential, e.g., the internal ground potential VSS, i.e., a reference potential of 0V is applied to the lower region 11B of the substrate 11 and the n-buried layer 18, and a negative voltage, e.g., −0.5V is applied to the upper region 11A of the substrate 11. In this state, the DRAM is operated as follows.

["1" Data Read/Write]

While column gates 112 shown in FIG. 8 are "OFF", the potentials of sense amplifier driving signals SAP and /SAN for driving CMOS bit line sense amplifiers 111 are changed to a precharge level, e.g., VDD/2 to deactivate the bit line sense amplifiers 111. A precharge signal φEQL is changed to "H" level to activate bit line equalizers 113. As a result, a pair of bit lines BL and /BL (e.g., BL1, /BL1, BL2, and /BL2) are precharged. A bit line precharge level VPRCH is, e.g., VDD/2.

The sense amplifier driving signal SAP is a driving signal for driving the pMOS portion of the CMOS bit line sense amplifier, and the sense amplifier driving signal /SAN is a driving signal for driving the nMOS portion of the CMOS bit line sense amplifier.

Then, the precharge signal φEQL is changed to "L" level to deactivate the bit line equalizers 113. In response to this, the pair of bit lines BL and /BL float at the precharge level.

A row address is decoded by the row decoder to select a word line WL (WL1 to WL4) subjected to a data read/write. A positive potential is supplied from a word line driver WDRV to the selected word line WL. For example, when the word line WL2 is selected, of memory cells MC11 to MC42, the transfer transistors of memory cells using the word line WL2 as their gates are turned on. In FIG. 8, these memory cells are the memory cells MC21 and MC22. Then, the bit line pair BL1 floating at the precharge level and the storage electrode of the memory cell MC21 are electrically connected. Similarly, the bit line pair BL2 floating at the precharge level and the storage electrode of the memory cell MC22 are electrically connected. If the capacitors of the memory cells MC21 and MC22 have been charged, they are discharged toward the bit lines BL1 and BL2. As a result, the potentials of the bit lines BL1 and BL2 become higher by +ΔV than the bit lines /BL1 and /BL2 at the precharge level, as shown in FIG. 9A.

The potential of the sense amplifier driving signal SAP is changed from the precharge level VDD/2 to an internal power supply voltage VDD (about 2V). Similarly, the potential of the sense amplifier driving signal /SAN is changed from the precharge level VDD/2 to the internal ground potential VSS (0V), thereby activating the sense amplifiers 111. Each of the activated sense amplifiers 111 senses the potential difference +ΔV appearing between a corresponding pair of bit lines and amplifies the potential different +ΔV. With this operation, the potentials of the bit lines BL1 and BL2 substantially increase to the potential of the sense amplifier driving signal SAP, i.e., the internal power supply voltage VDD. On the other hand, the potentials of the bit lines /BL1 and /BL2 substantially decrease to the potential of the sense amplifier driving signal /SAN, i.e., the internal ground potential VSS.

As the potentials of the bit lines BL1 and BL2 increase to the internal power supply voltage VDD, the potentials of the storage electrodes of the memory cells MC21 and MC22 increase to the internal power supply voltage VDD. As a result, the capacitors of the memory cells MC21 and MC22 are charged to rewrite "1" data (data refresh).

After that, the potential of the word line WL2 is decreased to turn off the transfer transistors of the memory cells MC21 and MC22.

The potential of the sense amplifier driving signal SAP is changed from the internal power supply voltage VDD to the precharge level VDD/2, and the potential of the sense amplifier driving signal /SAN is changed from the internal ground potential VSS to the precharge level VDD/2, thereby deactivating the sense amplifiers 111. The precharge signal φEQL is changed from "L" level to "H" level to activate the bit line equalizers 113. Accordingly, the pairs of bit lines BL and /BL (BL1, /BL1, BL2, and /BL2) are set at the precharge level VPRCH (VDD/2) and precharged.

["0" Data Read/Write]

While the column gates 112 shown in FIG. 8 are "OFF", the potentials of the sense amplifier driving signals SAP and /SAN for driving the bit line sense amplifiers 111 are changed to the precharge level, e.g., VDD/2 to inactivate the bit line sense amplifiers 111. The precharge signal φEQL is changed to "H" level to activate the bit line equalizers 113. With this operation, the pairs of bit lines BL and /BL (e.g., BL1, /BL1, BL2, and /BL2) are precharged. The precharge level VPRCH of the bit line is, e.g., VDD/2.

Then, the precharge signal φEQL is changed to "L" level to deactivate the bit line equalizers 113. In response to this, the pairs of bit lines BL and /BL float at the precharge level.

A row address is decoded by the row decoder to select a word line WL (WL1 to WL4) subjected to a data read/write. A positive potential is supplied to the selected word line WL from the word line driver WDRV. For example, when the word line WL3 is selected, of the memory cells MC11 to MC42, the transfer transistors of memory cells using the word line WL3 as their gates are turned on. In FIG. 8, these memory cells are the memory cells MC31 and MC32. Then, the bit line pair BL1 floating at the precharge level and the storage electrode of the memory cell MC31 are electrically connected. Similarly, the bit line pair BL2 floating at the precharge level and the storage electrode of the memory cell MC32 are electrically connected. If no charge is accumulated in the capacitors of the memory cells MC31 and MC32, they are charged from the bit lines BL1 and BL2. As a result, the potentials of the bit lines BL1 and BL2 become lower by $-\Delta V$ than the bit lines /BL1 and /BL2 at the precharge level, as shown in FIG. 9B.

The potential of the sense amplifier driving signal SAP is changed from the precharge level VDD/2 to the internal power supply voltage VDD (about 2V). Similarly, the potential of the sense amplifier driving signal /SAN is changed from the precharge level VDD/2 to the internal ground potential VSS (0V), thereby activating the sense amplifiers 111. Each of the activated sense amplifiers 111 senses the potential difference $-\Delta V$ appearing between a corresponding pair of bit lines and amplifies the potential difference $-\Delta V$. With this operation, the potentials of the bit lines BL1 and BL2 substantially decrease to the potential of the sense amplifier driving signal /SAN, i.e., the internal ground potential VSS. On the other hand, the potentials of the bit lines /BL1 and /BL2 substantially increase to the potential of the sense amplifier driving signal SAP, i.e., the internal power supply voltage VDD.

As the potentials of the bit lines BL1 and BL2 decrease to the internal ground potential VSS, the potentials of the storage electrodes of the memory cells MC31 and MC32 increase to the internal ground potential VSS. As a result, the capacitors of the memory cells MC31 and MC32 are discharged to rewrite "0" data (data refresh).

After that, the potential of the word line WL3 is decreased to turn off the transfer transistors of the memory cells MC31 and MC32.

The potential of the sense amplifier driving signal SAP is changed from the internal power supply voltage VDD to the precharge level VDD/2, and the potential of the sense amplifier driving signal /SAN is changed from the internal ground potential VSS to the precharge level VDD/2, thereby deactivating the sense amplifiers 111. The precharge signal φEQL is changed from "L"0 level to "H" level to activate the bit line equalizers 113. Accordingly, the pairs of bit lines BL and /BL (BL1, /BL1, BL2, and /BL2) are set at the precharge level VPRCH (VDD/2) and precharged.

In the DRAM, "1" or "0" data is retained by repeatedly executing the above data read/write at cycles on the order of, e.g., "nsec".

For a data read request, a column address is decoded by the column decoder to select a pair of bit lines (columns) subjected to a data read. For example, when the pair of bit lines BL1 and /BL1 are selected, a column selection signal CSL1 is changed to "H" level to turn on a column gate 112-1. Then, data are read through the pair of bit lines BL1 and /BL1 to a pair of data lines DQ and /DQ. The column gates 112 (112-1 and 112-2) are kept "ON" while the potential difference between the pair of bit lines is amplified, i.e., during the "sense & refresh" period shown in FIGS. 9A and 9B.

As shown in FIGS. 1 and 2, the capacitor can be regarded from its sectional structure as an insulated gate transistor in which the electrode 15 inside the trench serves as a gate electrode, the capacitor insulating film 13 serves as a gate insulating film, and a pair of n-buried layers 18 located on the two sides of the trench 12 serve as source and drain regions. Since the upper region 11A and the n-buried layer 18 are reverse-biased, minority carriers (electrons in the first embodiment) are injected from one of the pair of n-buried layers 18 serving as a source region to the lower region 11B of the substrate 11. As a result, an inversion layer is formed by the minority carriers on the side surface of the substrate 11 in the trench 12 in the lower region 11B. Since the n-buried layers 18 serving as source and drain regions are set at the same potential (reference potential), they are in a thermal equibrium condition, and no minority carrier flows into the other one of the pair of n-buried layers 18 serving as a drain region. The inversion layer by the minority carriers and the electrode 15 having the capacitor insulating film 13 constitute a capacitor. That is, since no potential difference (0V) is generated between a pair of n-buried layers 18 serving as source and drain regions and between the n-buried layer 18 and the lower region 11B, the minority carriers do not move but remain along the channel (so-called trench interface). Note that the trench interface is an interface located at a lower level than the n-buried layer 18.

In the DRAM cell having the above structure, no $n^+$-diffusion region serving as one electrode of the capacitor need be formed at a portion of the substrate facing the trench, unlike the conventional DRAM cell. Even if the frontage of the trench becomes smaller along with an increase in integration degree of cells, the trench can be easily made deep to increase the capacitance value of the capacitor. More specifically, unlike the conventional DRAM cell, an impurity-doped insulating film serving as a solid phase diffusion source need not be deposited in the trench, and the impurity need not be diffused from this insulating film into the side surface inside the trench. A sufficiently large capacitance value can be obtained by burying the plate-like n-buried layer 18 in the substrate and forming the trench 12 like a test tube stuck into the plate-like n-buried layer 18. Consequently, a sufficient capacitance value of the capacitor can be ensured even at a high integration degree, and degradation in data storage characteristics can be prevented.

Note that the source region 19, the n-buried layer 18, and the upper region 11A of the substrate 11 present between them form an npn structure. Since the thick silicon oxide film 14 is formed at the position of this npn structure, no parasitic insulated gate transistor is formed at this position. Therefore, even upon application of a positive voltage to the conductive layer 16 and the electrode 15, the source region 19 and the n-buried layer 18 are not rendered conductive, and no current flows therethrough.

[N-Buried Layer 18]

Next, the formation position and resistance value of the n-buried layer 18 will be described.

Figure 10:
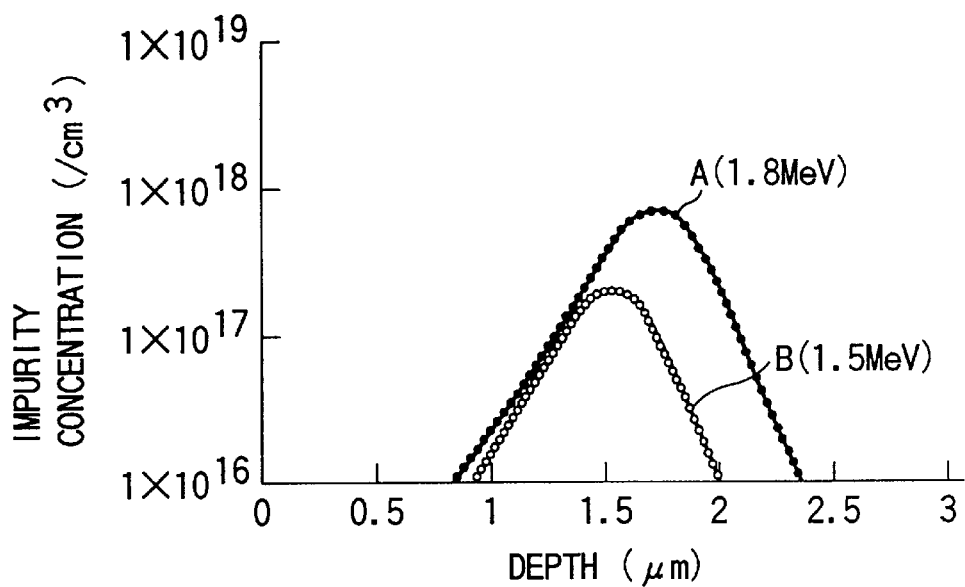
FIG. 10 is a graph showing the impurity profile of an n-buried layer.

FIG. 10 is a graph showing the impurity profile of the n-buried layer 18. FIG. 10 particularly shows the impurity profile when the n-buried layer 18 is formed by ion-implanting phosphorous (P).

Both characteristics A and B shown in FIG. 10 represent impurity profiles when the dose of phosphorous is set to, e.g., $1 \times 10^{13}/cm^2$. The characteristic A is obtained when the ion acceleration voltage is set to 1.8 MeV; and the characteristic B, the ion-acceleration voltage is set to 1.5 MeV. In either case, the n-buried layer 18 has a predetermined width in the direction of depth after the implanted ions are activated by annealing. The distance from the major surface of the substrate 11 to the upper surface of the n-buried layer 18 is set to about 1 μm. If the distance from the major surface of the substrate 11 to the upper surface of the n-buried layer 18 is too short, punch-through may occur between the source region 19 of the insulated gate transistor and the n-buried layer 18. To ensure a sufficient breakdown voltage, the distance between them is preferably set to at least 0.5 μm or more.

Figure 11:
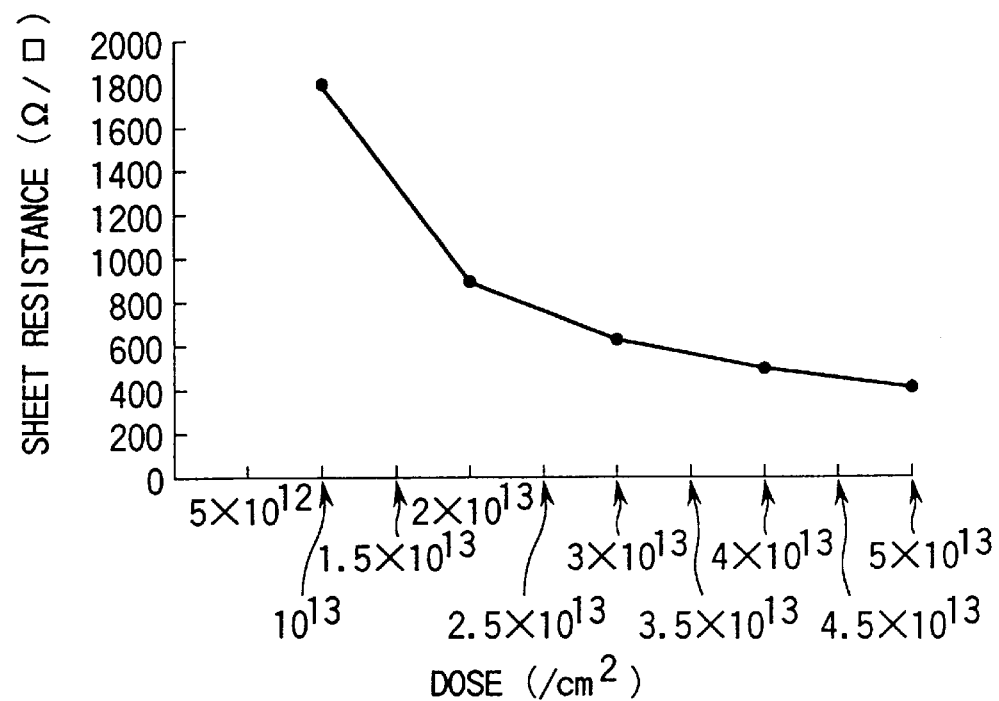
FIG. 11 is a graph showing the relationship between the dose and the sheet resistance in the n-buried layer.

FIG. 11 is a graph showing the relationship between the dose and the sheet resistance in the n-buried layer 18. FIG. 11 particularly shows the relationship when n-impurity ions are phosphorous ions.

As shown in FIG. 11, when the dose substantially exceeds $2 \times 10^{13}/cm^2$, the sheet resistance of the n-buried layer 18 decreases to 1,000Ω or less. It was experimentally confirmed that, if the sheet resistance of the n-buried layer 18 was set to 1,000Ω or less, minority carriers were generated or disappeared satisfactorily quickly, and thus no error occurred during the operation of the DRAM. Therefore, when the n-buried layer 18 is formed by ion-implanting phosphorous, the dose is set to $2 \times 10^{13}/cm^2$ or more to decrease the sheet resistance to 1,000Ω or less.

Note that the minority carriers are minority carriers with respect to the lower region 11B and are electrons. That is, the n-buried layer 18 functions as a minority carrier supply source. The minority carriers form an inversion layer (n type) along the trench 12 in the lower region 11B. To make the n-buried layer 18 function as the minority carrier supply source, its sheet resistance suffices to be 1,500Ω or less.

[Trench Capacitor]

The voltage-capacitance characteristics of the trench capacitor will be explained below.

Figure 12:
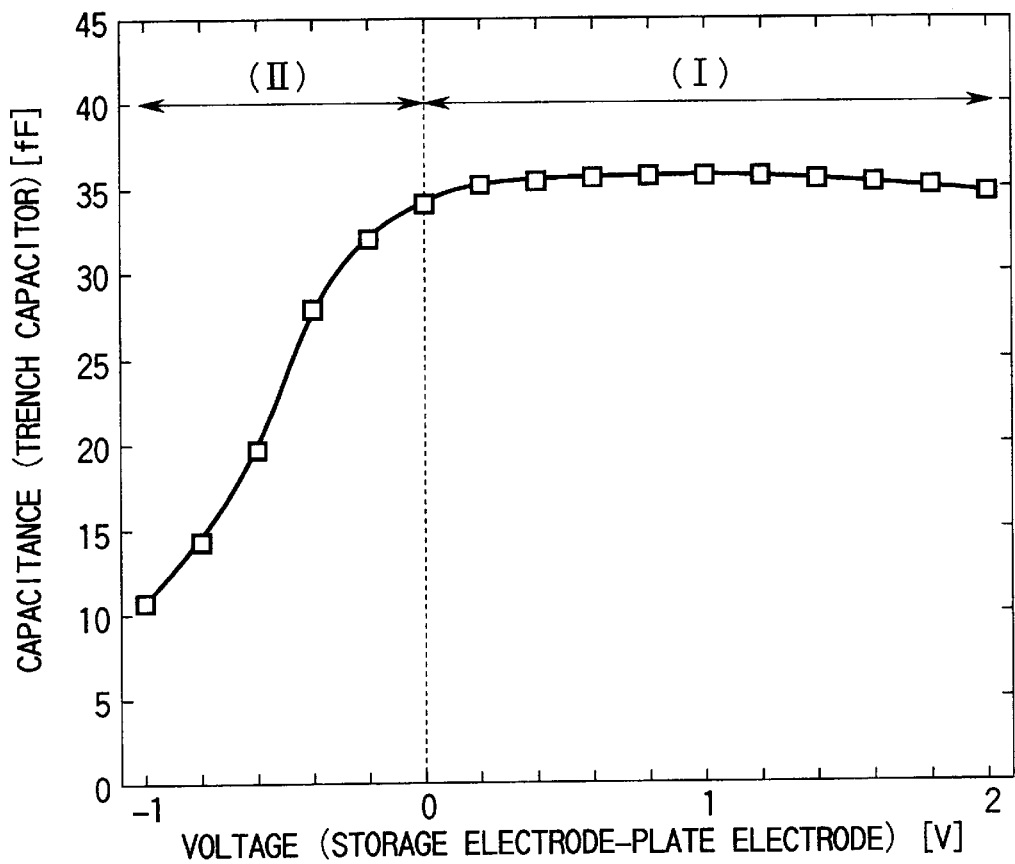
FIG. 12 is a graph showing the voltage-capacitance characteristics of the trench capacitance of the dynamic memory cell according to the present invention.

FIG. 12 is a graph showing the voltage-capacitance characteristics of the trench capacitance of the dynamic memory cell according to the present invention.

As shown in FIG. 12, the voltage-capacitance characteristics of the trench capacitance of the dynamic memory cell according to the present invention have a region (I) where the capacitance is almost constant, and a region (II) where the capacitance changes. In general, when the potential difference (voltage) between the storage electrode 15 and the plate electrode is "positive", the capacitance is almost constant; if "negative", the capacitance decreases. This phenomenon may occur due to the following reason. FIG. 13A is a view showing the state of the trench capacitor before power-on. FIG. 13B is a view showing a state (I) of the trench capacitor after power-on. FIG. 13C is a view showing a state (II) of the trench capacitor after power-on.

As shown in FIG. 13A, in the trench capacitor before power-on, the conductivity type around the trench 12 is the p type. Note that a depletion layer is formed because of the presence of a p-n junction between the n-buried layer 18 and the lower region 11B.

As shown in FIG. 13B, when the potential of the storage electrode 15 increases higher than that of the lower region 11B after power-on, a depletion layer is formed around the trench 12, an n-inversion layer is formed in the depletion layer, and the trench 12 is completely covered with the n-inversion layer. In this state, the dielectric film of the trench capacitor is only the capacitor insulating film 13, and the capacitance exhibits the maximum value. This is the state of the region (I) shown in FIG. 12.

As shown in FIG. 13C, when the potential of the storage electrode 15 decreases lower than that of the lower region 11B after power-on, the n-inversion layer starts disappearing, and the trench 12 is not completely covered with the n-inversion layer. In this state, the dielectric film of the trench capacitor is made up of the capacitor insulating film 13 and the depletion layer, so the capacitance decreases smaller than that in the state shown in FIG. 13B. This is the state of the region (II) shown in FIG. 12.

If the n-inversion layer around the trench 12 completely disappears, and the depletion layer also disappears, only the capacitor insulating film 13 serves as the dielectric film of the trench capacitor, and the capacitance exhibits the maximum value. In the DRAM, however, since the refresh of data is repeatedly executed in a cycle of "nsec", the n-inversion layer and the depletion layer do not completely disappear. That is, since the "nsec" is a very short time, all electrons constituting the n-inversion layer cannot recombine with holes. For this reason, the n-inversion layer and the depletion layer may mixedly exist, as shown in FIG. 13C.

[First Use Example of Dynamic Memory Cell According to Present Invention]

In the dynamic memory cell, such a change in capacitance of the capacitor is unpreferable. The dynamic memory cell according to the present invention is desirably used with the characteristic of the region (I).

An example of using the dynamic memory cell according to the present invention with the characteristic of the region (I) is to set the plate potential VPL equal to or lower than the minimum value of the voltage of the bit line shown in FIGS. 9A and 9B. With this setting, the potential difference (voltage) between the storage electrode 15 and the plate electrode can be prevented from becoming "negative". The dynamic memory cell according to the present invention can be used with the characteristic of the region (I).

In general, the potential of the bit line does not take a negative value during the circuit operation. For example, the minimum potential of the bit line during the circuit operation is a driving potential VSAN of the driving signal/SAN for driving the nMOS sense amplifier. The driving potential VSAN is generally the internal ground potential VSS (0V). In consideration of this, as a concrete example, the plate potential VPL is set to the internal ground potential VSS (0V). That is, the n-buried layer 18 is biased to the internal ground potential VSS.

The accumulable charge amount of the trench capacitance when the plate potential VPL is set to the internal ground potential VSS (0V) will be explained.

Figure 14A:
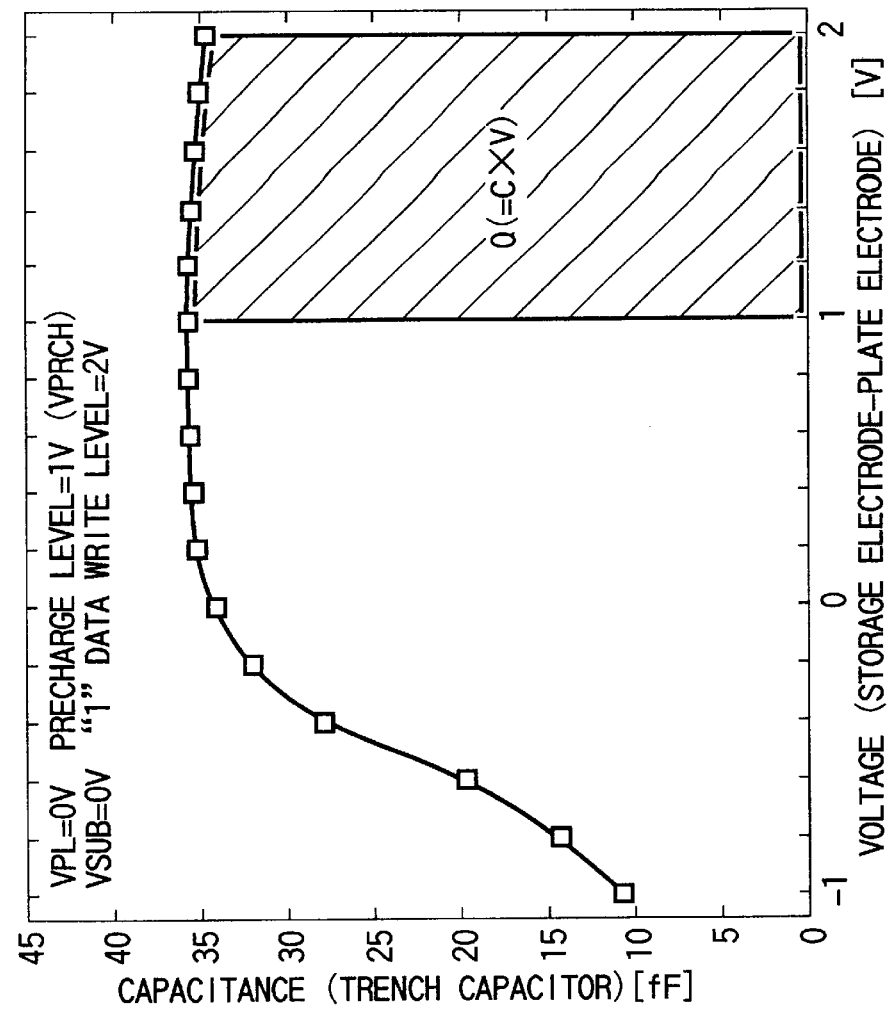
FIG. 14A is a graph showing an accumulation charge amount Q upon writing "1" data in the dynamic memory cell according to the present invention.
Figures 15A, 15B:
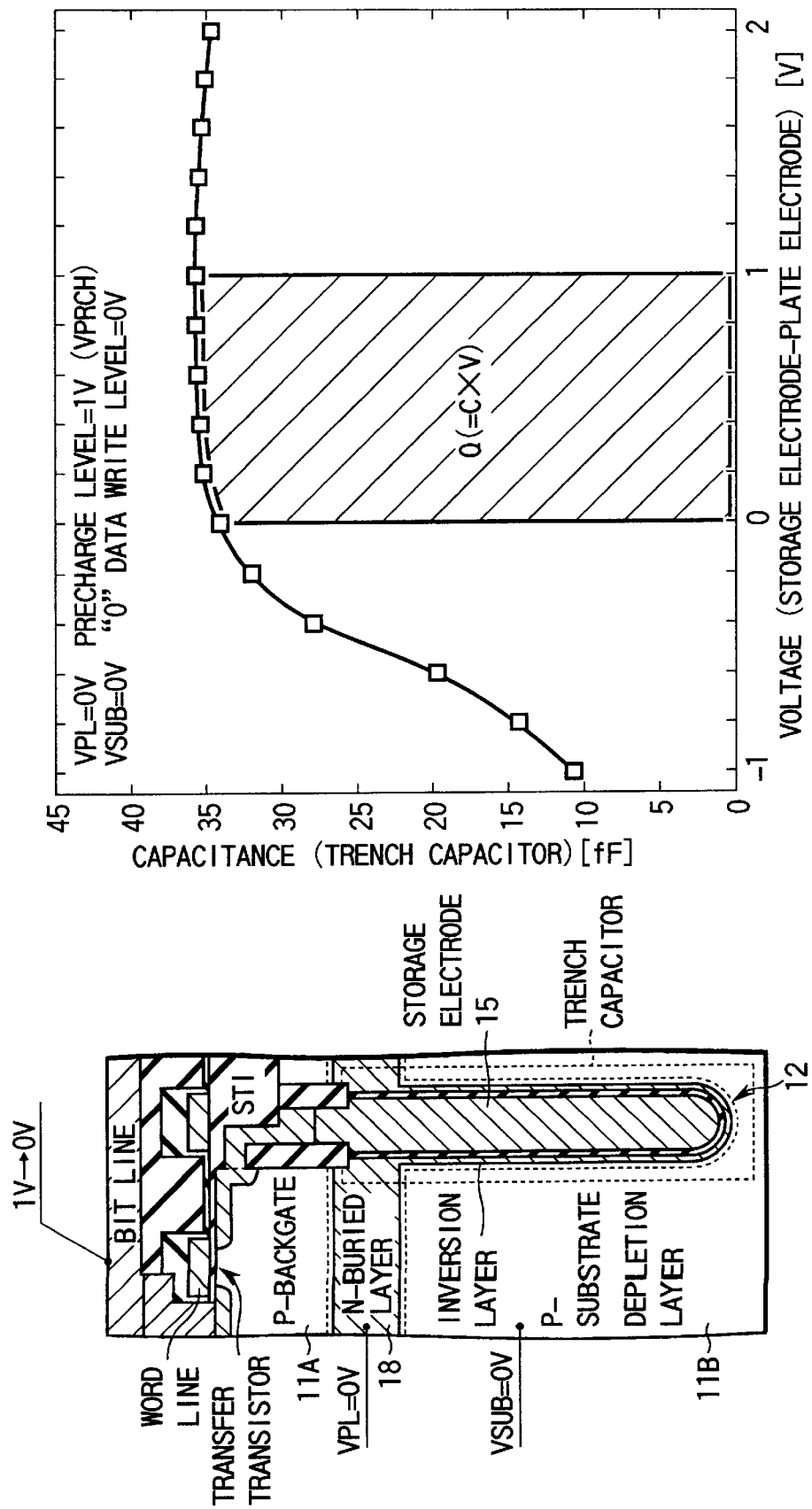
FIG. 15A is a graph showing the accumulation charge amount Q upon writing "0" data in the dynamic memory cell according to the present invention.
FIG. 15B is a view showing the potential states of the bit line, the n-buried layer, and the lower region upon writing "0" data.

FIG. 14A is a graph showing an accumulation charge amount Q upon writing "1" data in the dynamic memory cell according to the present invention. FIG. 15A is a graph showing the accumulation charge amount Q upon writing "0" data in the dynamic memory cell according to the present invention. Note that data is written under the conditions: the plate potential VPL=0V, the substrate potential VSUB=0V, the bit line precharge level=1V, the "1" data write level=2V, and the "0" data write level=0V.

Figure 14B:
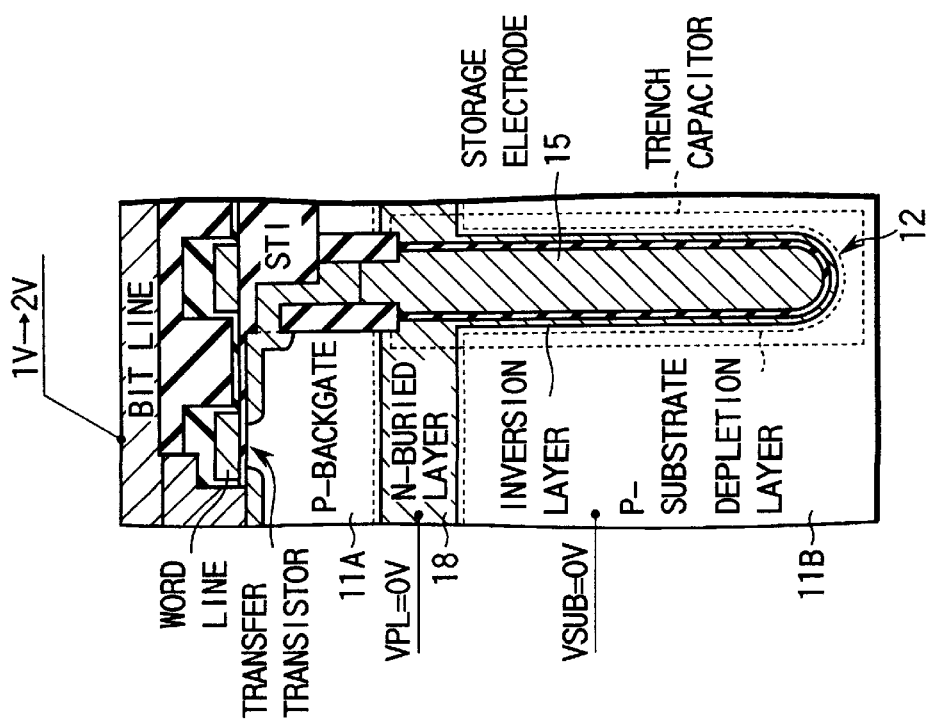
FIG. 14B is a view showing the potential states of a bit line, the n-buried layer, and a lower region upon writing "1" data.

FIG. 14B is a view showing the potential states of the bit line, the n-buried layer 18, and the lower region 11B upon writing "1" data. FIG. 15B is a view showing the potential states of the bit line, the n-buried layer 18, and the lower region 11B upon writing "0" data.

["1" Data Write]

As shown in FIGS. 14A and 14B, after the potential of the bit line is changed to a precharge level of 1V, the transfer transistor is turned "on" to connect the storage electrode 15 to the bit line. The potential of the storage electrode 15 at this time is almost equal to a precharge level of 1V. Thereafter, the potential of the bit line is changed to a "1" data write level of 2V. Along with this, the potential of the storage electrode 15 increases from 1V to 2V. Since the charge amount Q=capacitance C×voltage V, the charge amount Q accumulated in the trench capacitor at this time changes to a state indicated by the hatched portion in FIG. 14A.

["0" Data Write]

As shown in FIGS. 15A and 15B, after the potential of the bit line is changed to a precharge level of 1V, the transfer transistor is turned "on" to connect the storage electrode 15 to the bit line. The potential of the storage electrode 15 at this time is almost equal to a precharge level of 1V. Then, the potential of the bit line is changed to a "0" data write level of 0V. Along with this, the potential of the storage electrode 15 decreases from 1V to 0V. Since the charge amount Q=capacitance C×voltage V, the charge amount Q accumulated in the trench capacitor at this time changes to a state indicated by the hatched portion in FIG. 15A.

As described above, by setting the plate potential VPL equal to or lower than the minimum value of the potential of the bit line, the dynamic memory cell according to the present invention can be used within the range of the region (I) shown in FIG. 12. Accordingly, the capacitance C hardly decreases in both the "1" data write and the "0" data write, and the dynamic memory cell according to the present invention can be used with the maximum capacitance. That is, a sufficient amount of charges can be accumulated in both the "1" data write and the "0" data write.

In the first use example, the minimum potential of the bit line is set to the internal ground potential VSS (0V). However, when, e.g., the driving potential VSAN takes a negative value, the plate potential VPL may also be set to a negative potential in accordance with the driving potential VSAN.

[Second Use Example of Dynamic Memory Cell According to Present Invention]

In the first use example, a sufficient charge amount can be advantageously accumulated in both the "1" data write and the "0" data write. However, the difference between the plate potential VPL and the maximum value of the voltage of the bit line is large, and the electric field applied to the capacitor insulating film 13 is large. One method of increasing the capacitance of the capacitor is to make the capacitor insulating film 13, i.e., the dielectric film of the capacitor thin. If, however, the electric field applied to the capacitor insulating film 13 is large, the capacitor insulating film 13 becomes difficult to make thin. In the dynamic memory cell according to the present invention, therefore, the electric field applied to the capacitor insulating film 13 is desirably decreased.

An example of decreasing the electric field applied to the capacitor insulating film 13 of the dynamic memory cell according to the present invention is to set the bit line precharge level and the plate potential VPL shown in FIGS. 9A and 9B substantially equal to each other. With this setting, the electric field applied to the capacitor insulating film 13 can be kept unchanged even when the potential of the storage electrode 15 becomes "positive" or "negative" with respect to the potential of the plate electrode. The electric field applied to the capacitor insulating film 13 can be decreased, compared to, e.g., the first use example. More specifically, both the precharge level and the plate potential VPL are set to the internal ground potential VSS (0V). The precharge level is the precharge level VPRCH supplied to the bit line equalizer.

Figure 16A:
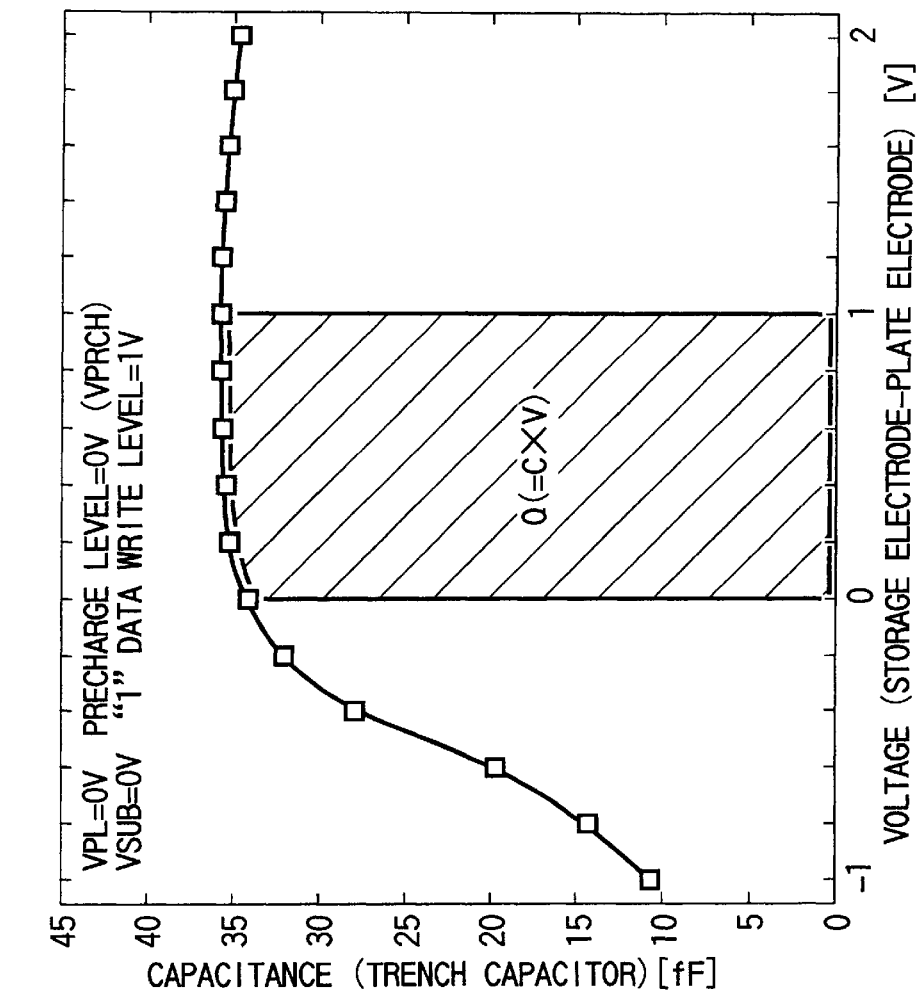
FIG. 16A is a graph showing the accumulation charge amount Q upon writing "1" data in the dynamic memory cell according to the present invention.
Figure 17A:
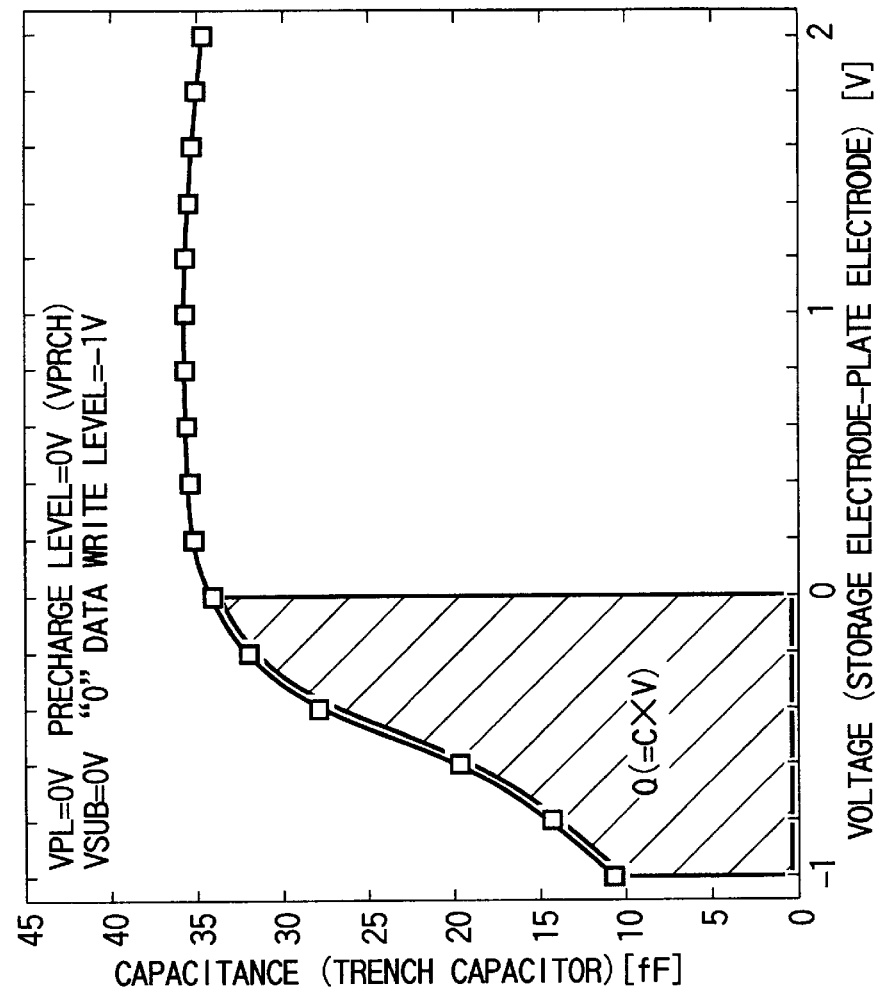
FIG. 17A is a graph showing the accumulation charge amount Q upon writing "0" data in the dynamic memory cell according to the present invention.

FIG. 16A is a graph showing the accumulation charge amount Q upon writing "1" data in the dynamic memory cell according to the present invention. FIG. 17A is a graph showing the accumulation charge amount Q upon writing "0" data in the dynamic memory cell according to the present invention. Note that data is written under the conditions: the plate potential VPL=0V, the substrate potential VSUB=0V, the bit line precharge level=0V, the "1" data write level=1V, and the "0" data write level=−1V.

Figure 16B:
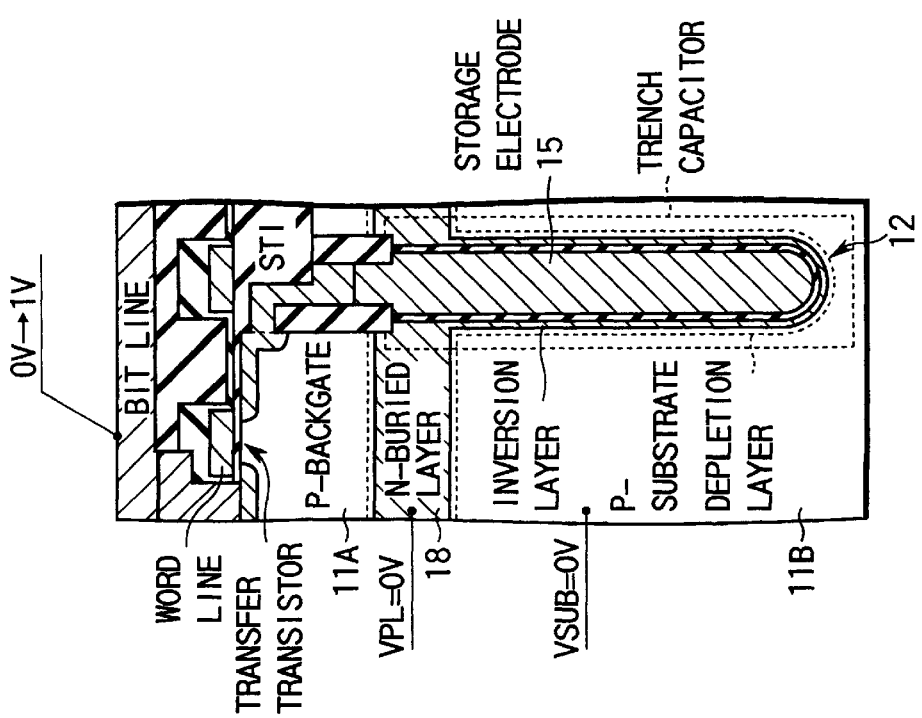
FIG. 16B is a view showing the potential states of the bit line, the n-buried layer, and the lower region upon writing "1" data.
Figure 17B:
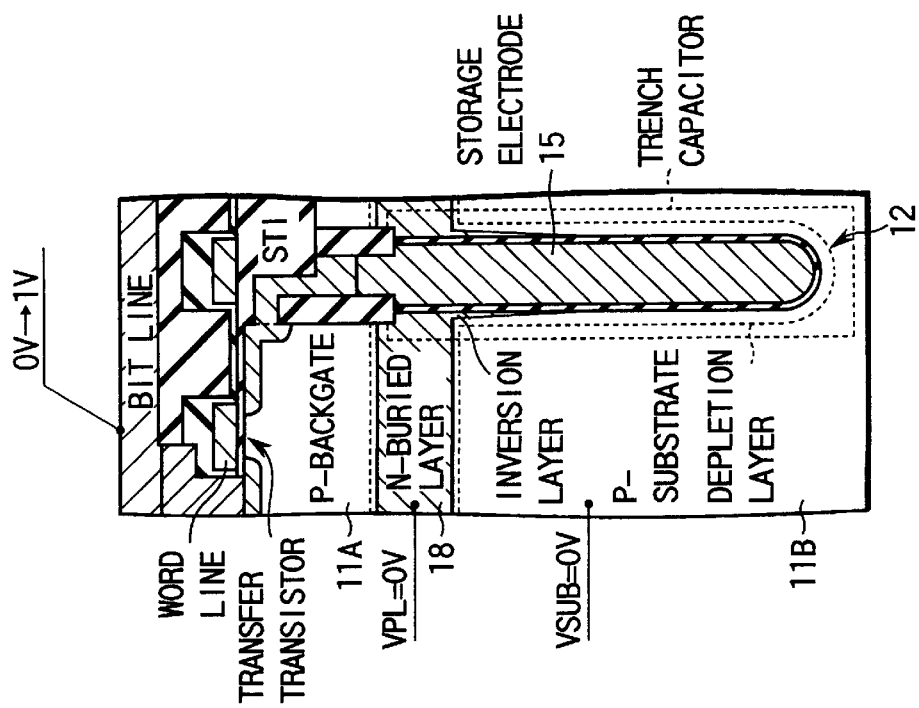
FIG. 17B is a view showing the potential states of the bit line, the n-buried layer, and the lower region upon writing "0" data.

FIG. 16B is a view showing the potential states of the bit line, the n-buried layer 18, and the lower region 11B upon writing "1" data. FIG. 17B is a view showing the potential states of the bit line, the n-buried layer 18, and the lower region 11B upon writing "0" data.

["1" Data Write]

As shown in FIGS. 16A and 16B, after the potential of the bit line is changed to a precharge level of 0V, the transfer transistor is turned "on" to connect the storage electrode 15 to the bit line. The potential of the storage electrode 15 at this time is almost equal to the precharge level of 0V. After that, the potential of the bit line is changed to a "1" data write level of 1V. Along with this, the potential of the storage electrode 15 increases from 0V to 1V. Since the charge amount Q=capacitance C×voltage V, the charge amount Q accumulated in the trench capacitor at this time changes to a state indicated by the hatched portion in FIG. 16A.

["0" Data Write]

As shown in FIGS. 17A and 17B, after the potential of the bit line is changed to a precharge level of 0V, the transfer transistor is turned "on" to connect the storage electrode 15 to the bit line. The potential of the storage electrode 15 at this time is almost equal to the precharge level of 0V. Then, the potential of the bit line is changed to a "0" data write level of −1V. Along with this, the potential of the storage electrode 15 decreases from 0V to −1V. Since the charge amount Q=capacitance C×voltage V, the charge amount Q accumulated in the trench capacitor at this time changes to a state indicated by the hatched portion in FIG. 17A.

In this manner, by setting the plate potential VPL and the bit line precharge level substantially equal to each other, the electric field applied to the capacitor insulating film 13 can be decreased. That is, both the potential difference between the plate potential VPL (0V) and the potential (almost 1V) of the storage electrode 15 upon writing "1" data, and the potential difference between the plate potential VPL (0V) and the potential (almost −1V) of the storage electrode 15 upon writing "0" data are about 1V.

As shown in FIG. 17A, in the second use example, the capacitance C decreases upon writing "0" data because the potential of the storage electrode 15 becomes "negative" with respect to the plate potential VPL. Accordingly, the accumulable charge amount Q is smaller than that upon writing "1" data. This characteristic is unpreferable, as described above, but the second use example is not useless. Even if the capacitance C tends to decrease, the second use example can be adopted without posing any problem as far as the resultant charge amount Q is large enough to retain "0" data.

In the first use example, the electric field applied to the capacitor insulating film 13 is large, but the voltage of the internal power supply is low. For example, although a conventional internal power supply voltage is generally 5V, a voltage in currently available LSI products is mainly 3V. In practice, LSI products satisfactorily operate even at an internal power supply voltage of 3V or less, or an internal power supply voltage of 2V as in the first embodiment. In the future, the voltage will be decreased to 2V or less. In this way, the electric field applied to the capacitor insulating film 13 can be decreased by decreasing the internal power supply voltage.

Both the first and second use examples can therefore be employed satisfactorily. In actual use, an optimal one is selected and practiced.

[Third Use Example of Dynamic Memory Cell According to Present Invention]

Figure 18:
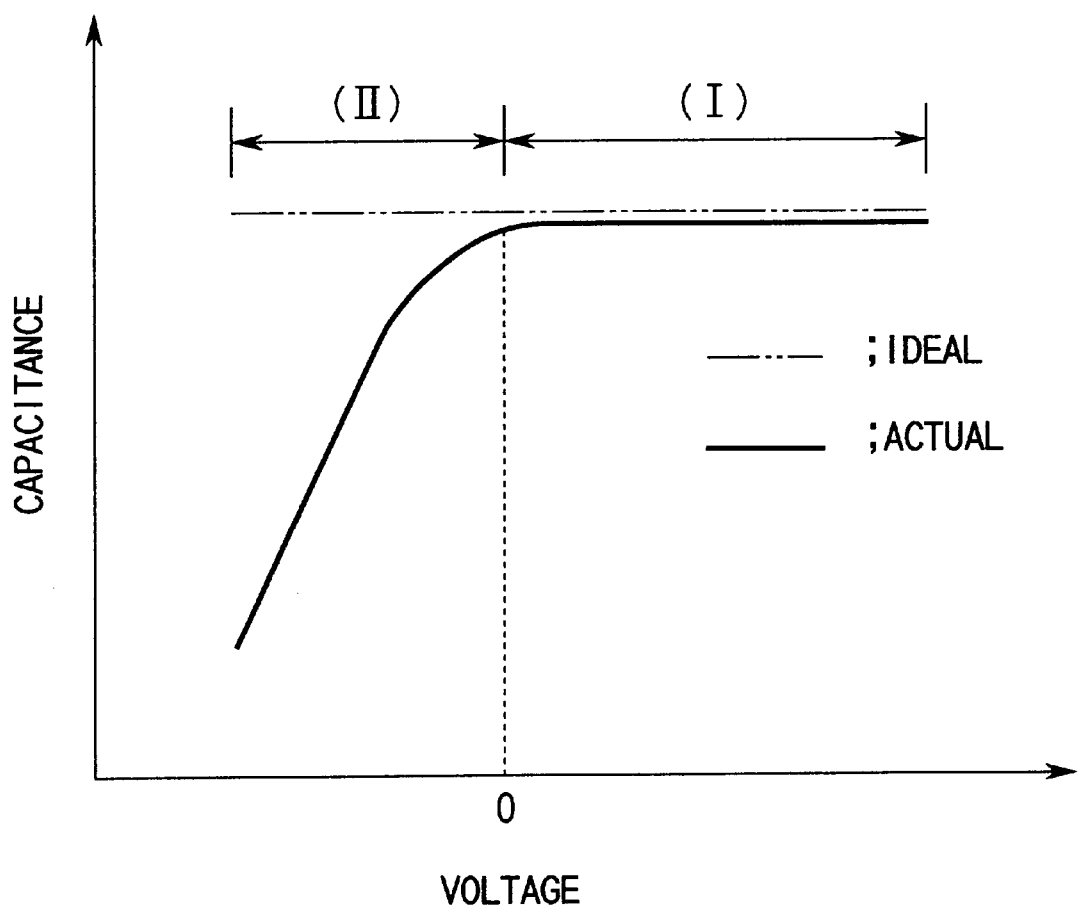
FIG. 18 is a graph schematically showing the voltage-capacitance characteristics of the trench capacitor of the dynamic memory cell according to the present invention.

FIG. 18 is a graph showing the voltage-capacitance characteristics of the trench capacitor of the dynamic memory cell according to the present invention. FIG. 18 schematically shows the characteristics shown in FIG. 12.

In practice, as shown in FIG. 18, the capacitance starts decreasing when the potential difference between the storage electrode 15 and the plate electrode becomes "negative". As a result, the accumulable charge amount decreases. Ideally, the capacitance is kept constant even when the potential difference between the storage electrode 15 and the plate electrode is "negative" or "positive".

The purpose of the third use example is to solve the problem of a decrease in accumulable charge amount when the potential difference between the storage electrode 15 and the plate electrode becomes "negative", and to increase the accumulable charge amount when the potential difference becomes "negative".

Figure 19A:
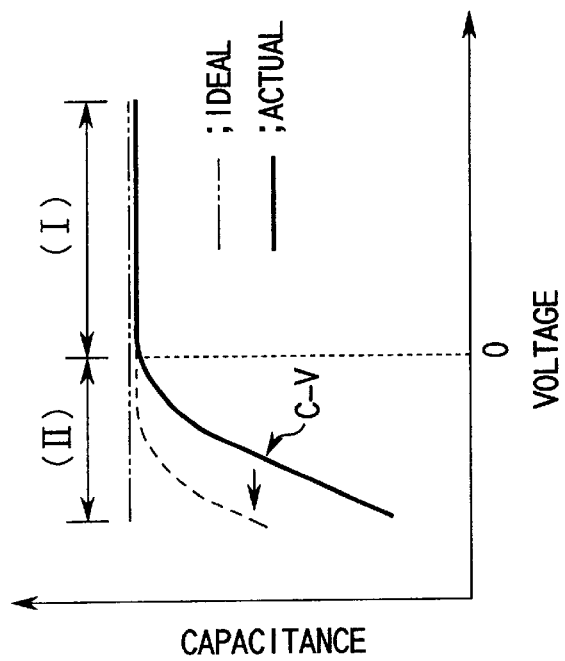
FIG. 19A is a graph showing the voltage-capacitance characteristic curve of the third use example.
Figure 19B:
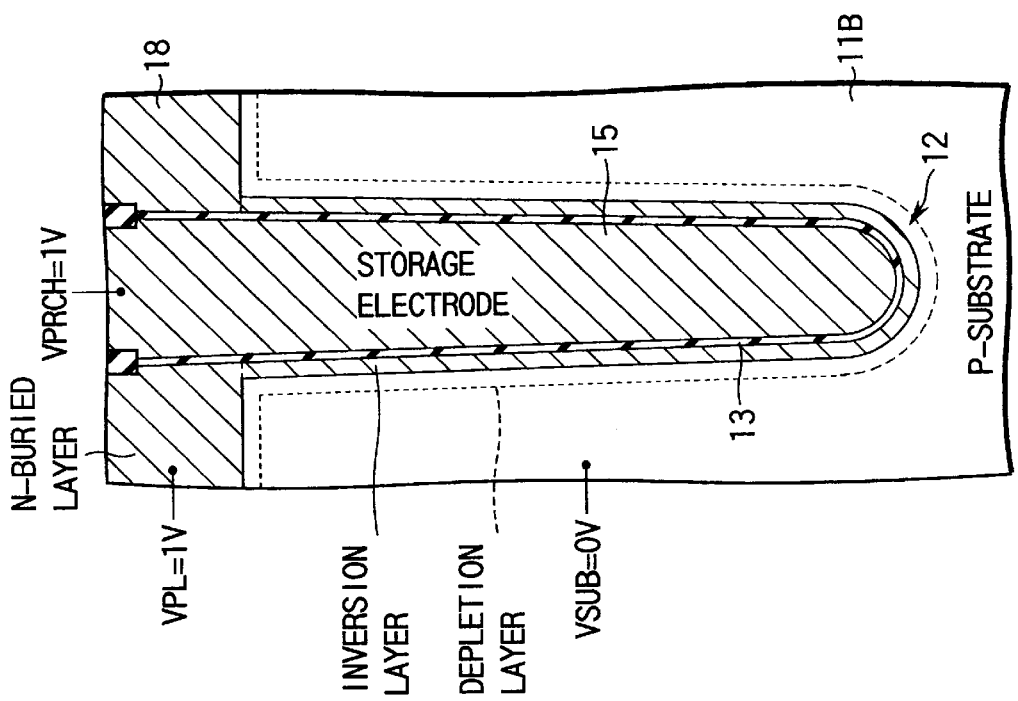
FIG. 19B is a view showing the potential states of the n-buried layer and the lower region upon application of a precharge level to a storage electrode according to the third use example.

FIG. 19A is a graph showing the voltage-capacitance characteristic curve of the third use example. FIG. 19B is a view showing the potential states of the n-buried layer 18 and the lower region 11B upon application of the precharge level (VPRCH) to the storage electrode 15 according to the third use example.

As shown in FIG. 19A, the third use example is to shift a capacitance-voltage characteristic curve C-V in the negative direction, as indicated by the broken line. For this purpose, the inversion layer shown in FIG. 13B is made difficult to disappear even when the potential difference between the storage electrode 15 and the plate electrode becomes "negative". In the third use example, as shown in FIG. 19B, the substrate potential VSUB is set lower than the precharge level, i.e., the precharge potential VPRCH, and lower than the plate potential VPL. The precharge potential VPRCH is the precharge potential VPRCH supplied to the bit line equalizer. With this setting, when the storage electrode 15 becomes at the precharge potential VPRCH, a positive potential difference can be generated between the storage electrode 15 and the lower region 11B. If the storage electrode 15 and the lower region 11B have a positive potential difference, the storage electrode 15 generates an inversion layer in the lower region 11B around the trench 12.

Upon the "0" data write, the potential of the storage electrode 15 changes from the precharge potential VPRCH to, e.g., 0V. However, as far as at least the storage electrode 15 is at the precharge potential VPRCH, a satisfactory inversion layer exists. Accordingly, the state wherein the inversion layer starts disappearing can be shifted in the negative direction, compared to, e.g., the second use example. In this manner, the accumulable charge amount can be increased when the potential difference between the storage electrode 15 and the plate electrode becomes "negative".

In the third use example, the plate potential VPL can be set equal to the precharge potential VPRCH (precharge level), similar to the second use example. For this reason, the third use example also has the effect of decreasing the electric field applied to the capacitor insulating film 13, as in the second use example.

[Second Embodiment]

The second embodiment structurally solves the problem of a decrease in accumulable charge amount when the potential difference between a storage electrode 15 and the plate electrode becomes "negative".

Figure 20A:
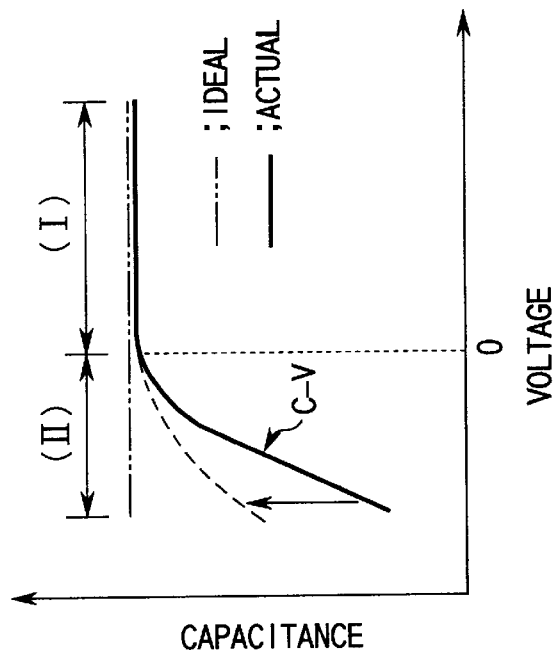
FIG. 20A is a graph showing the voltage-capacitance characteristic curve of the trench capacitor of a dynamic memory cell according to the second embodiment of the present invention.
Figure 20B:
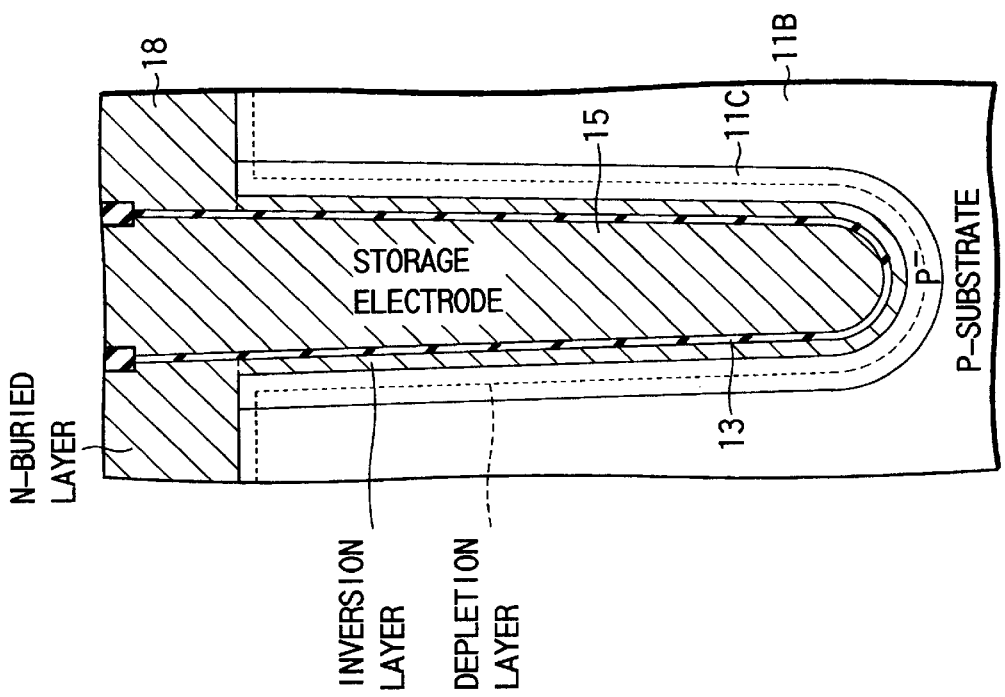
FIG. 20B is a sectional view of the trench capacitor of the dynamic memory cell according to the second embodiment of the present invention.

FIG. 20A is a graph showing the voltage-capacitance characteristic curve of the trench capacitor of a dynamic memory cell according to the second embodiment of the present invention. FIG. 20B is a sectional view of the trench capacitor of the dynamic memory cell according to the second embodiment of the present invention.

As shown in FIG. 20A, the second embodiment is to decrease the rate of decrease in capacitance of a capacitance-voltage characteristic curve C-V, as indicated by the broken line. For this purpose, the inversion layer shown in FIG. 13B is made difficult to disappear even when the potential difference between the storage electrode 15 and the plate electrode becomes "negative". In the second embodiment, a region whose p-impurity dose is lower than that of a lower region 11B is formed around a trench 12. More specifically, as shown in FIG. 20B, a $p^-$-region 11C having a p-impurity concentration lower than that of the p-lower region 11B is formed around the trench 12.

By forming, around the trench 12, the $p^-$-region 11C having a p-impurity concentration lower than that of the lower region 11B, an inversion layer containing a larger number of minority carriers (electrons in the second embodiment) is formed around the trench 12. If the inversion layer contains a larger number of minority carriers, the time required for the inversion layer to disappear is longer. The inversion layer therefore hardly disappears even when the potential difference between the storage electrode 15 and the plate electrode becomes "negative". With this structure, the accumulable charge amount can be increased when the potential difference between the storage electrode 15 and the plate electrode becomes "negative".

Note that the second embodiment can be used with a combination of the first, second, and third use examples described above.

[Manufacturing Method]

A method of manufacturing a DRAM comprising dynamic memory cells according to the present invention will be explained.

The DRAM chip comprising the dynamic memory cells according to the present invention is manufactured by five main steps.

That is, the main steps are the step of forming a trench capacitor, the step of forming shallow trench isolation (STI), the step of forming a transistor, the step of forming an internal wiring layer, and the step of forming an n-buried layer 18. The step of forming the n-buried layer 18 is particularly important in the dynamic memory cell according to the present invention. The manufacturing cost of the DRAM comprising the dynamic memory cells according to the present invention depends on where to place this step in the manufacturing sequence.

Three examples of a manufacturing sequence will be described below.

[First Example of a Manufacturing Sequence]

Figure 21A:
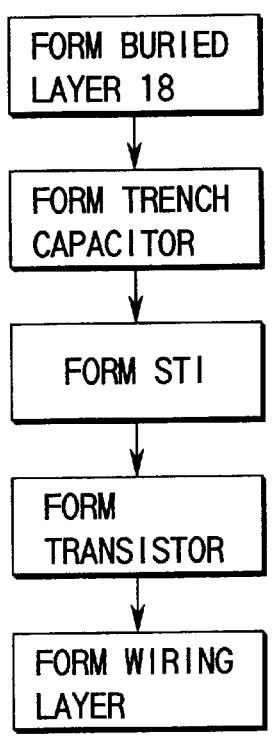
FIG. 21A is a flow chart showing the first example of manufacturing sequence for a DRAM comprising the dynamic memory cells according to the present invention.

FIG. 21A is a flow chart showing the first example of the manufacturing sequence for the DRAM comprising the dynamic memory cells according to the present invention.

As shown in FIG. 21A, in the first example of the manufacturing sequence, an n-buried layer 18 is first formed. Then, a trench capacitor, STI, a transistor, and a wiring layer are sequentially formed. The first example of manufacturing sequence is a method of forming a device structure from a deep portion of a substrate 11 toward its upper portion.

In the first example of the manufacturing sequence, a trench 12 is formed after the n-buried layer 18 is formed in the substrate 11. To form a dynamic memory cell according to the present invention, the trench 12 must be accurately aligned with the n-buried layer 18. The n-buried layer 18 is however formed at a deep portion of the substrate 11 and cannot be viewed from the surface of the substrate 11. For this reason, aligning the trench 12 with the n-buried layer 18 uses an alignment mark used for forming the n-buried layer 18. A typical example of the alignment mark is a mark such as an orientation flat indicating the direction of silicon crystals formed on a wafer.

The DRAM comprising the dynamic memory cells according to the present invention can be formed by the first example of the manufacturing sequence.

[Second Example of a Manufacturing Sequence]

A current orientation flat has a sufficient precision as an alignment mark. However, in LSI products manufactured by the most advanced techniques, i.e., DRAM products at an integration degree higher than the Mbit class, a mark with a higher precision than that of the orientation flat is required. For this reason, an alignment mark with a precision higher than that of the orientation flat is formed on the surface of a wafer before the n-buried layer 18 is formed.

However, this method additionally requires the step of forming an alignment mark, resulting in high manufacturing costs.

The purpose of the second example of the manufacturing sequence is therefore to provide a manufacturing method capable of aligning the trench 12 and the n-buried layer 18 at a high precision without forming any alignment mark.

Figure 21B:
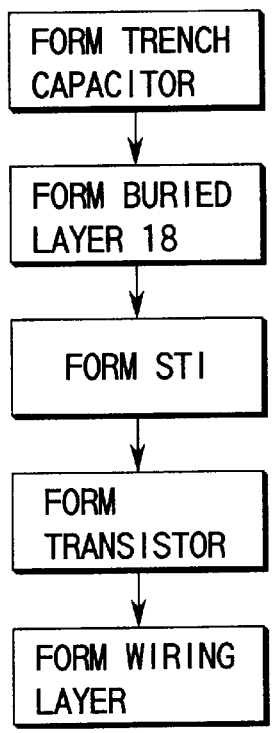
FIG. 21B is a flow chart showing the second example of manufacturing sequence for the DRAM comprising the dynamic memory cells according to the present invention.

FIG. 21B is a flow chart showing the second example of the manufacturing sequence for the DRAM comprising the dynamic memory cells according to the present invention.

As shown in FIG. 21B, in the second example of the manufacturing sequence, a trench capacitor is first formed. After that, an n-buried layer 18, STI, a transistor, and a wiring layer are sequentially formed.

In the second example of the manufacturing sequence, the n-buried layer 18 is formed after a trench 12 is internally formed from the surface of a substrate 11. The trench 12 is exposed to the surface of the substrate 11 and can be viewed from the surface of the substrate 11. That is, the trench 12 can be used as an alignment mark. By using the trench 12 as an alignment mark, the n-buried layer 18 can be accurately aligned with the trench 12 without separately forming an alignment mark.

[Third Example of a Manufacturing Sequence]

A reduction in manufacturing cost is important to supply low-cost products on the market. The best method for reducing the manufacturing cost is a mask-less method, i.e., not to adopt the photolithographic step. In a current LSI manufacturing method, the photolithographic step cannot be eliminated, but the number of masks can be decreased.

The purpose of the third example of the manufacturing sequence is to provide a manufacturing method capable of reducing the manufacturing cost.

Figure 21C:
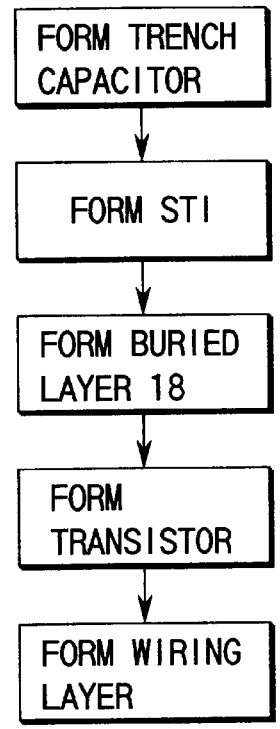
FIG. 21C is a flow chart showing the third example of manufacturing sequence for the DRAM comprising the dynamic memory cells according to the present invention.

FIG. 21C is a flow chart showing the third example of the manufacturing sequence for the DRAM comprising the dynamic memory cells according to the present invention.

As shown in FIG. 21C, in the third example of the manufacturing sequence, a trench capacitor and STI are formed, and then an n-buried layer 18 is formed. Thereafter, a transistor and a wiring layer are sequentially formed.

In the third example of the manufacturing sequence, the n-buried layer 18 is formed after a trench 12 and STI are formed. The n-buried layer 18 is formed below a portion where a memory cell array is to be formed. Ion implantation of a conductive impurity for forming the n-buried layer 18 is performed through an active region for the transfer transistor of a memory cell. To adjust the threshold voltage, a conductive impurity is generally ion-implanted in an active region where transistors including a transfer transistor and constituting an LSI are formed. In the third example of the manufacturing sequence, both active and isolation regions have been completed when the n-buried layer 18 is to be formed. The same mask can therefore be used for ion implantation of a conductive impurity for forming the n-buried layer 18, and ion implantation of a conductive impurity for adjusting the threshold voltage of the transfer transistor. Since ion implantation for forming the n-buried layer 18 and adjusting the threshold voltage is performed using the same mask, the number of masks can be decreased to reduce the manufacturing cost.

[Method of Manufacturing a Memory Cell]

A concrete example of the method of manufacturing a dynamic memory cell according to the present invention will be explained. The following manufacturing/forming method complies with the third example of the manufacturing sequence.

Figure 22A:
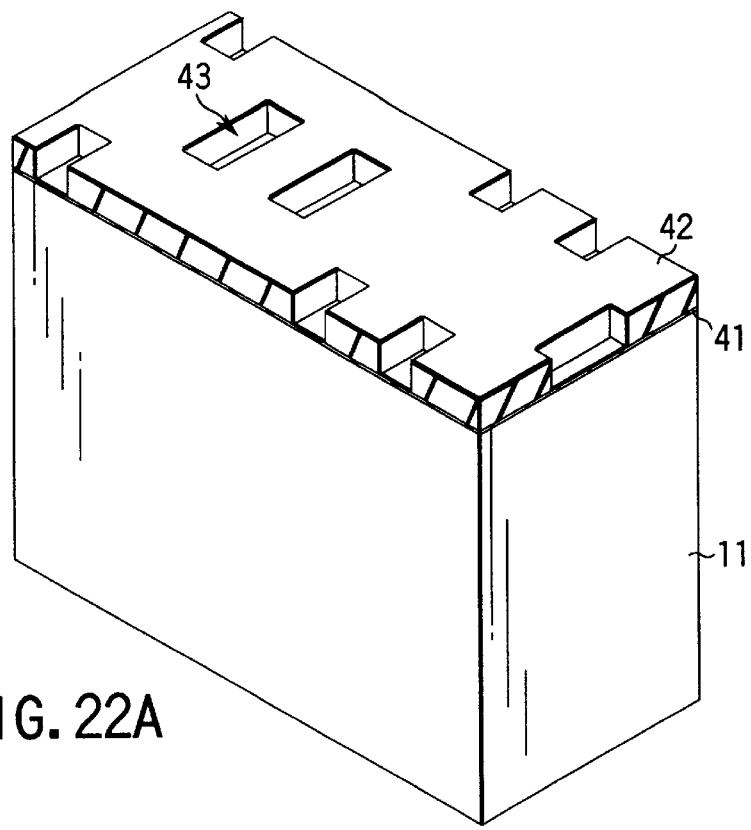
FIGS. 22A to 22N are perspective views respectively showing the main steps in manufacturing the dynamic memory cell according to the present invention.
Figure 22B:
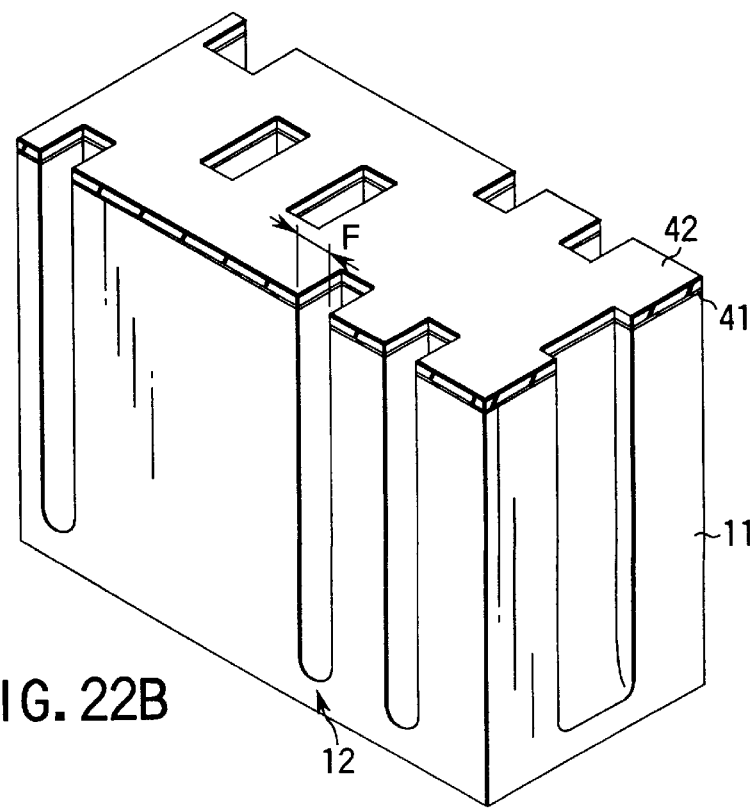
Figure 22C:
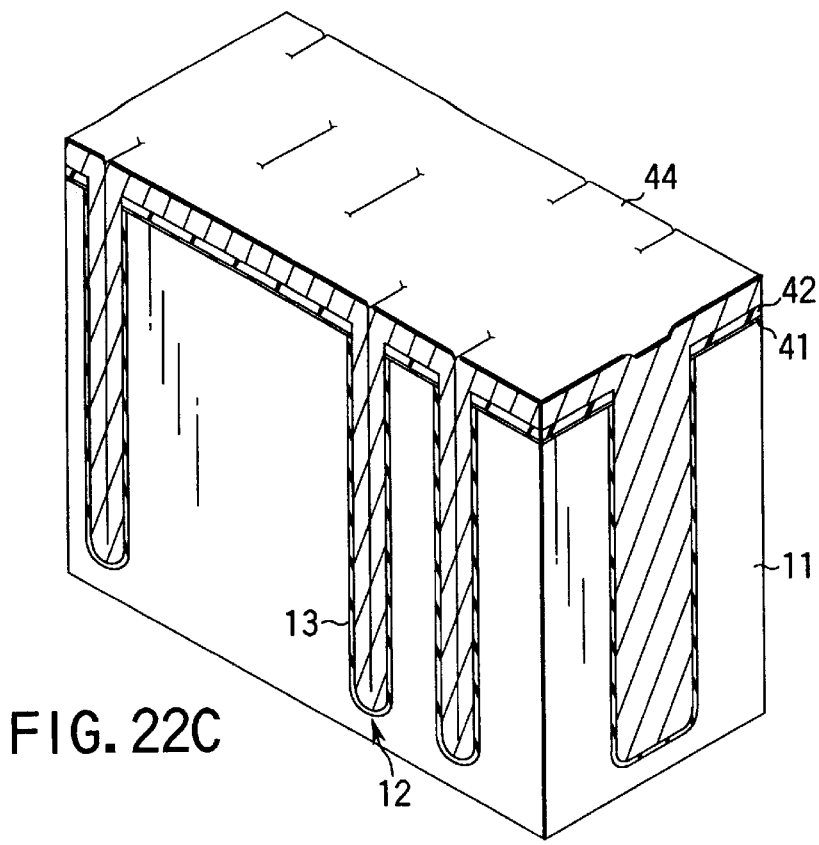
Figure 22D:
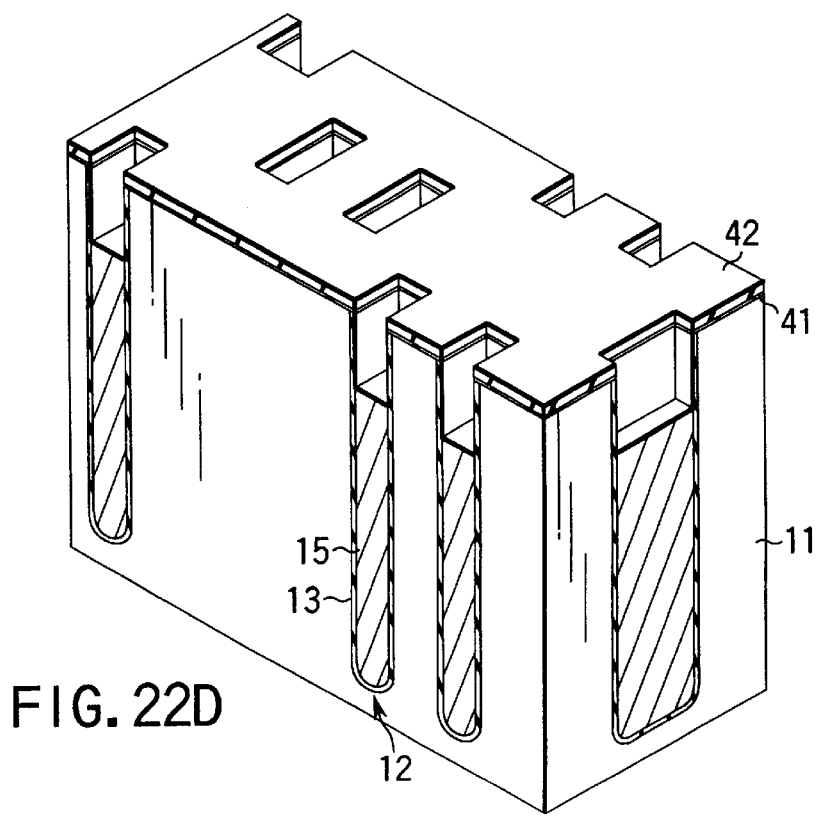
Figure 22E:
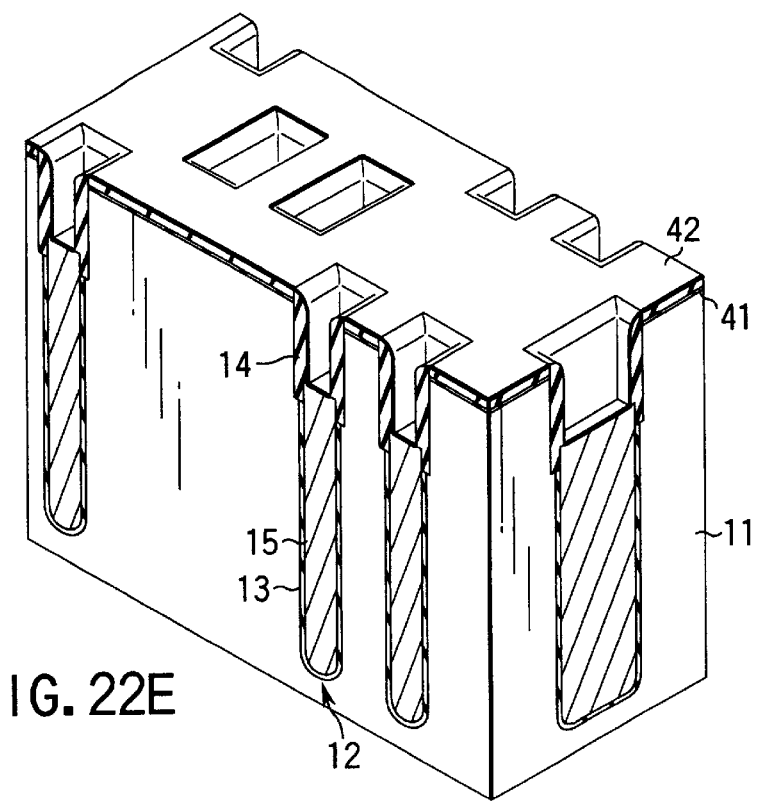
Figure 22F:
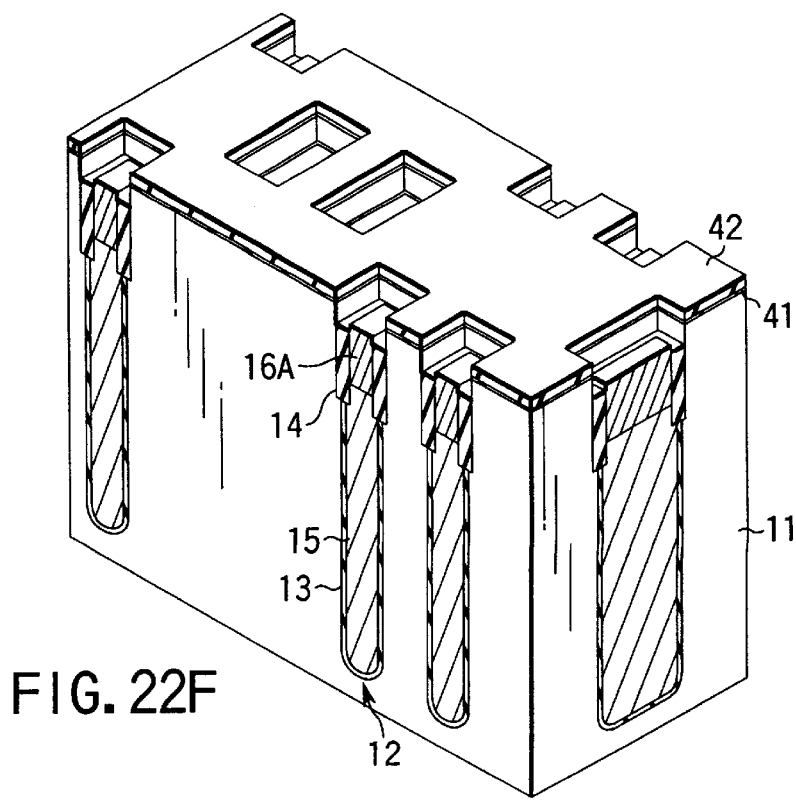
Figure 22G:
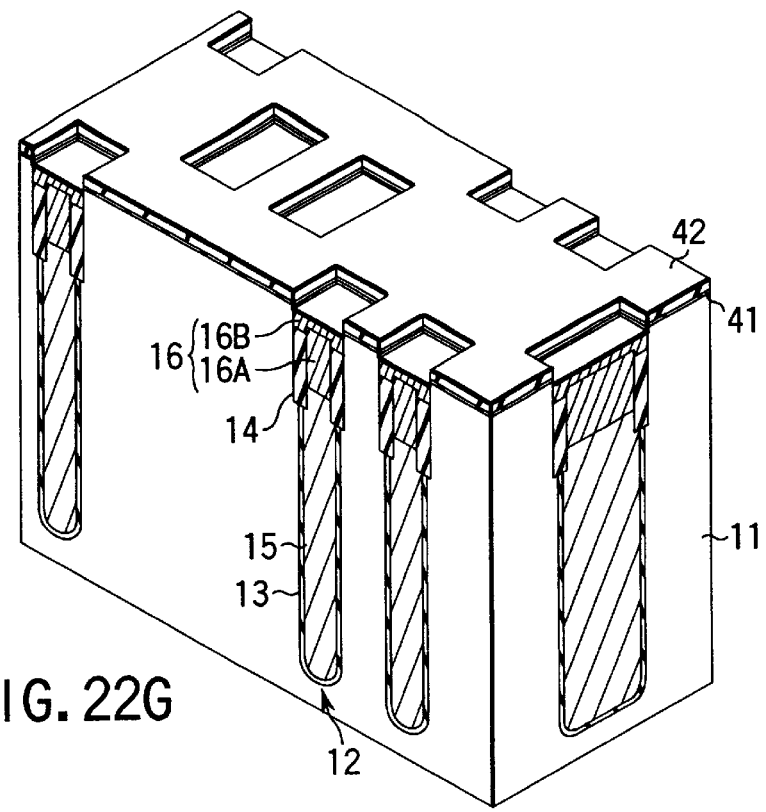
Figure 22H:
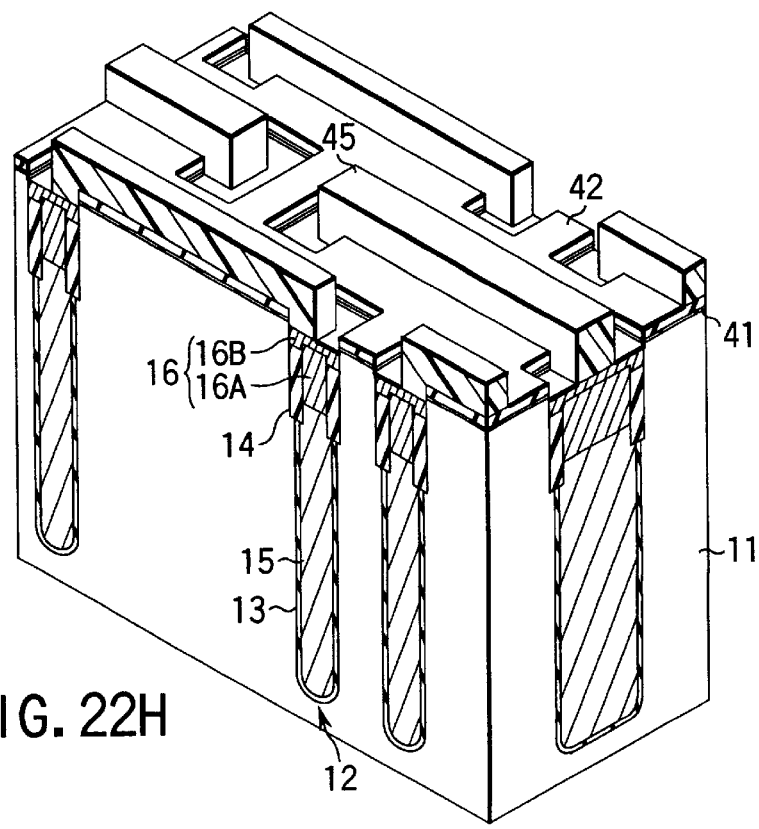
Figure 22I:
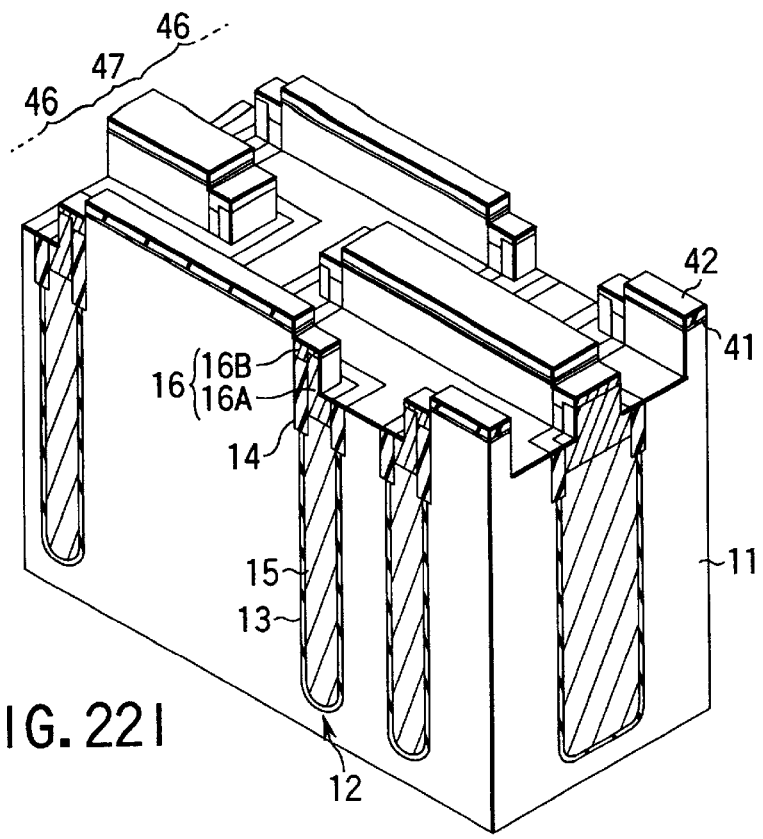
Figure 22J:
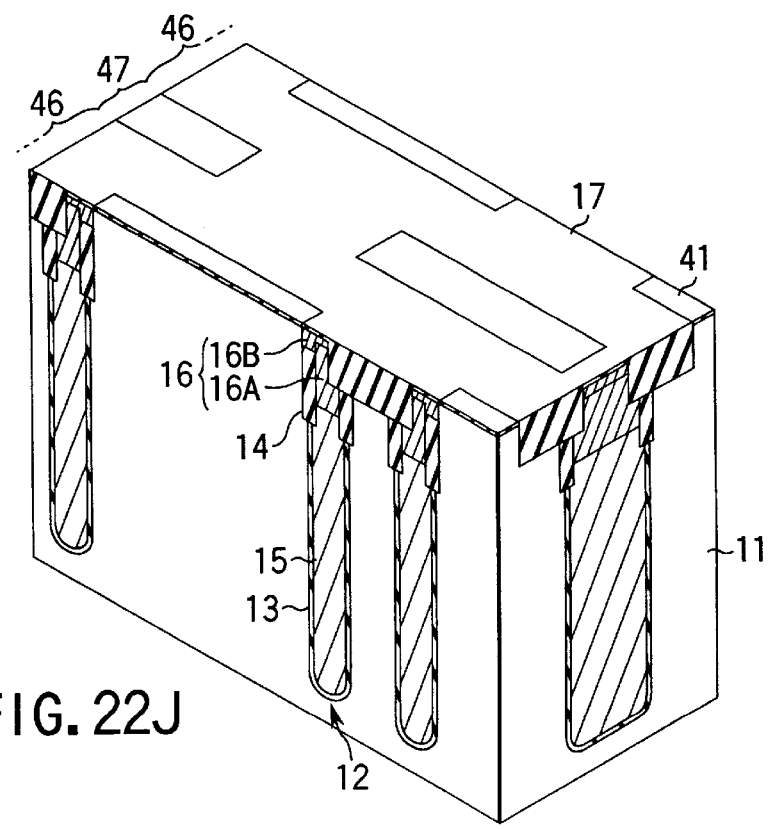
Figure 22K:
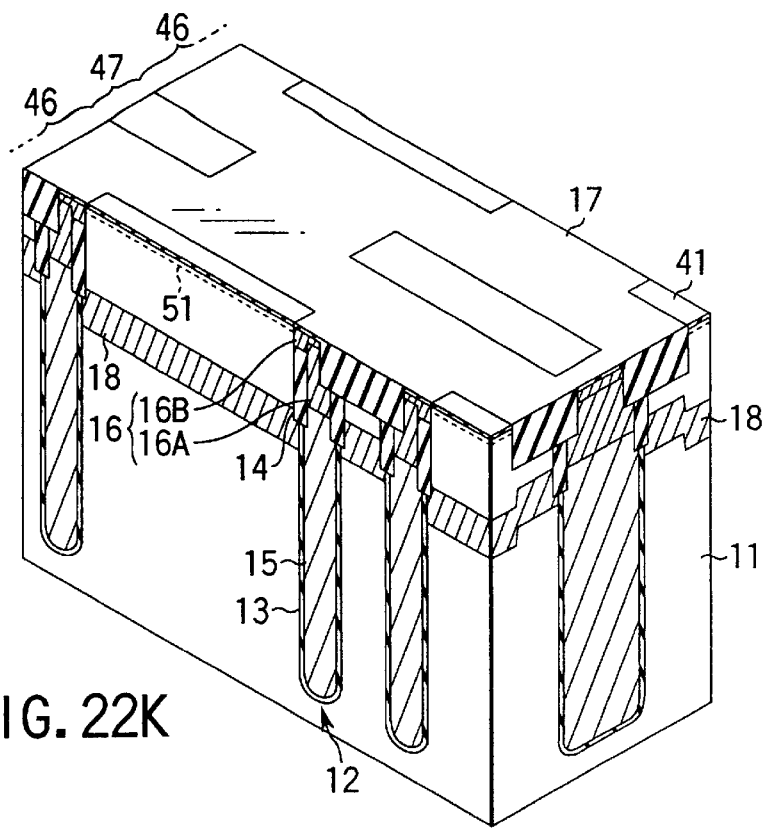
Figure 22L:
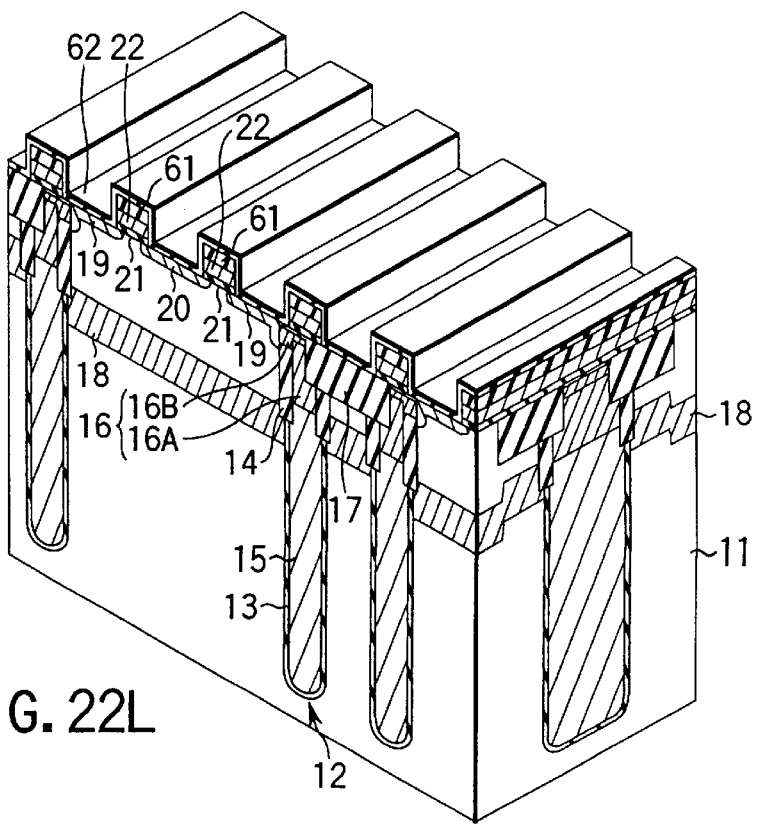
Figure 22M:
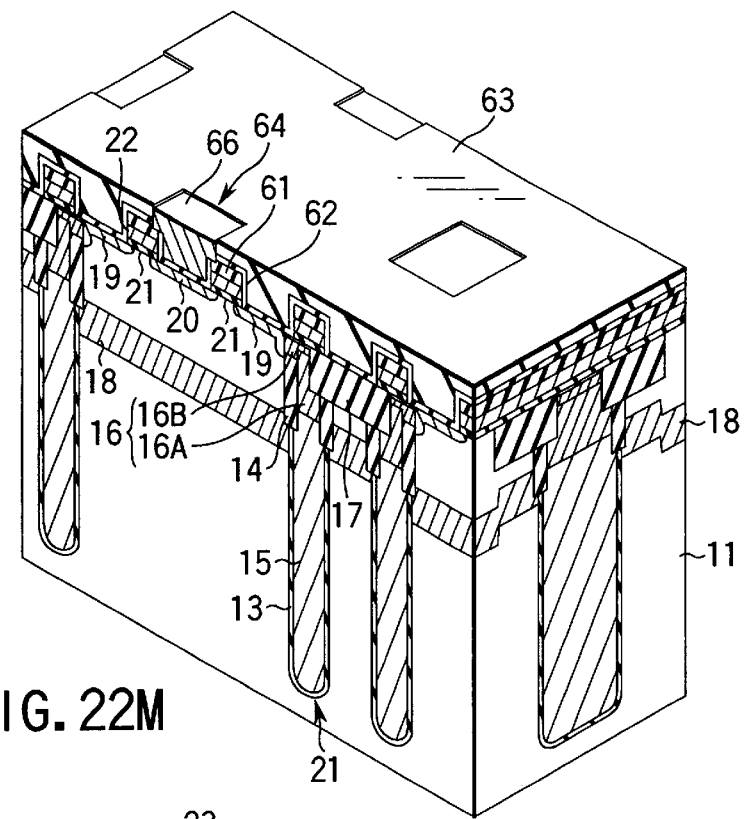
Figure 22N:
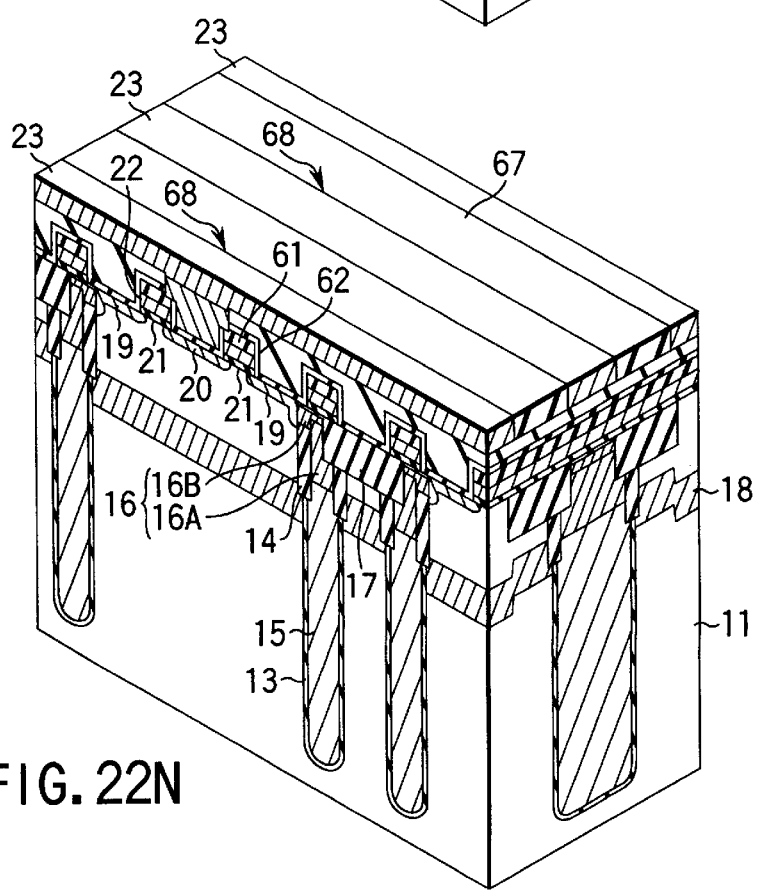

FIGS. 22A to 22N are perspective views respectively showing the main steps in manufacturing the dynamic memory cell according to the present invention.

As shown in FIG. 22A, the surface of a substrate 11 made of p-silicon is thermally oxidized to form a buffer oxide film ($SiO_2$) 41. Silicon nitride is deposited on the buffer oxide film 41 to form a silicon nitride film ($Si_3N_4$) 42. A photoresist is applied on the silicon nitride film 42 to form a photoresist film (not shown). A window corresponding to a trench formation pattern is formed in the photoresist film by photolithography. The silicon nitride film 42 is etched by RIE using the photoresist film as a mask, thereby forming a window 43 corresponding to a trench formation pattern in the silicon nitride film 42. An alignment mark used in this step is an orientation flat (not shown) or the like formed on the wafer (substrate 11).

As shown in FIG. 22B, the substrate 11 is etched by RIE using the silicon nitride film 42 as a mask, thereby forming a trench (deep trench) 12 with a frontage F of 0.3 $\mu$m and a depth of 7 $\mu$m in the substrate 11.

Note that in forming a dynamic memory cell according to the second embodiment shown in FIG. 20B, an impurity of a conductivity type opposite to that of the substrate 11, e.g., an n-impurity in the second embodiment can be ion-implanted after the trench 12 is formed.

As shown in FIG. 22C, the surface of the substrate 11 exposing in the trench 12 is thermally oxidized to form a capacitor insulating film 13 made of silicon oxide with a thickness of, e.g., about 10 nm. The capacitor insulating film 13 may be formed of not only the silicon oxide film but also a three-layered film (ONO film) of $SiO_2/Si_3N_4/SiO_2$ or a two-layered film (ON film) of $SiO_2/Si_3N_4$. Conductive polysilicon is deposited on the obtained structure to form a conductive polysilicon film 44. The polysilicon film 44 buries the trench 12, and contains an n-impurity as a conductive impurity.

As shown in FIG. 22D, the polysilicon film 44 is etched back by RIE using the silicon nitride film 42 as a stopper, thereby removing the polysilicon film 44 from the upper portion of the trench 12. The polysilicon film 44 left in the trench 12 serves as a storage electrode 15.

As shown in FIG. 22E, the capacitor insulating film 13 is etched by CDE using the silicon nitride film 42 and the storage electrode 15 as a mask, thereby removing the capacitor insulating film 13 from the upper portion of the trench 12. Silicon oxide is deposited on the obtained structure to form a silicon oxide film with a thickness of, e.g., about 30 to 40 nm. The silicon oxide film is etched by RIE using the silicon nitride film 42 and the storage electrode 15 as a stopper, thereby leaving the silicon oxide film on the side wall inside the trench 12. The silicon oxide film left on the side wall inside the trench 12 serves as a collar oxide film 14.

As shown in FIG. 22F, undoped polysilicon is deposited on the structure shown in FIG. 22E to form an undoped polysilicon film. The undoped polysilicon film is etched back by RIE using the silicon nitride film 42 as a stopper, thereby removing the polysilicon film from the upper portion of the trench 12. The undoped polysilicon film left in the trench 12 serves as a conductive layer 16 (16A) for leading the storage electrode 15 to the surface of the substrate 11. In this step, the conductive layer 16A has a high resistance value because the polysilicon film constituting the conductive layer 16A is undoped. However, the final resistance value of the conductive layer 16A is low enough to function as a conductor because an n-impurity is diffused (solid phase diffusion) from the storage electrode 15 during the subsequent manufacturing process. The capacitor insulating film 13 is etched by CDE using the silicon nitride film 42 and the conductive layer 16A as a mask, thereby removing the silicon oxide film 14 from the upper portion of the trench 12. As a result, the surface of the substrate 11 is exposed in the trench 12.

As shown in FIG. 22G, undoped polysilicon is deposited on the structure shown in FIG. 22F to form an undoped polysilicon film. The undoped polysilicon film is etched back by RIE using the silicon nitride film 42 as a stopper, thereby removing the polysilicon film from the upper portion of the trench 12. The undoped polysilicon film left in the trench 12 serves as a conductive layer 16 (16B) for leading the storage electrode 15 to the surface of the substrate 11. In this step, the conductive layer 16B also has a high resistance value, similar to the conductive layer 16A. However, the final resistance value of the conductive layer 16B is low enough to function as a conductor because an n-impurity is diffused (solid phase diffusion) from the storage electrode 15 during the subsequent manufacturing process. The conductive layer 16B is integrated with the conductive layer 16A to constitute the conductive layer 16 shown in. FIG. 1. The conductive layer 16B is in contact with the substrate 11 through the side wall inside the trench 12.

By these steps, a trench capacitor is completed. The flow shifts to a manufacturing sequence of forming STI.

To form the STI, a photoresist is applied on the structure shown in FIG. 22G to form a photoresist film, as shown in FIG. 22H. Windows corresponding to an STI formation pattern are formed in the photoresist film by photolithography. As a result, a plurality of individual photoresist films 45 are obtained. Each of the individual photoresist films 45 covers a corresponding active region. In this step, the trench 12 is used as an alignment mark. Accordingly, a formed active region is aligned with the trench 12 at a high precision.

As shown in FIG. 22I, the structure shown in FIG. 22H is etched by RIE using the photoresist films 45 as a mask, thereby forming a matrix-like shallow trench 46 in the structure shown in FIG. 22H. Then, the photoresist films 45 are removed. Each portion projecting from the shallow trench 46 serves as an active region 47.

As shown in FIG. 22J, silicon oxide is deposited on the structure shown in FIG. 22I to form a silicon oxide film. The silicon oxide film buries the shallow trench 46. The silicon oxide film is polished back by CMP using the silicon nitride film 42 as a stopper, thereby forming shallow trench isolation (STI) 17. Then, the silicon nitride film 42 is removed.

By the steps in FIGS. 22H to 22J, the STI is completed. The flow shifts to a manufacturing sequence of forming an n-buried layer 18.

To form the n-buried layer 18, a photoresist is applied on the structure shown in FIG. 22J to form a photoresist film, as shown in FIG. 22K. Windows corresponding to a formation pattern for the n-buried layer 18 are formed. Since FIG. 22K is an enlarged perspective view of part of a memory cell array, the windows formed in the photoresist film are not shown in FIG. 22K.

Figure 23A:
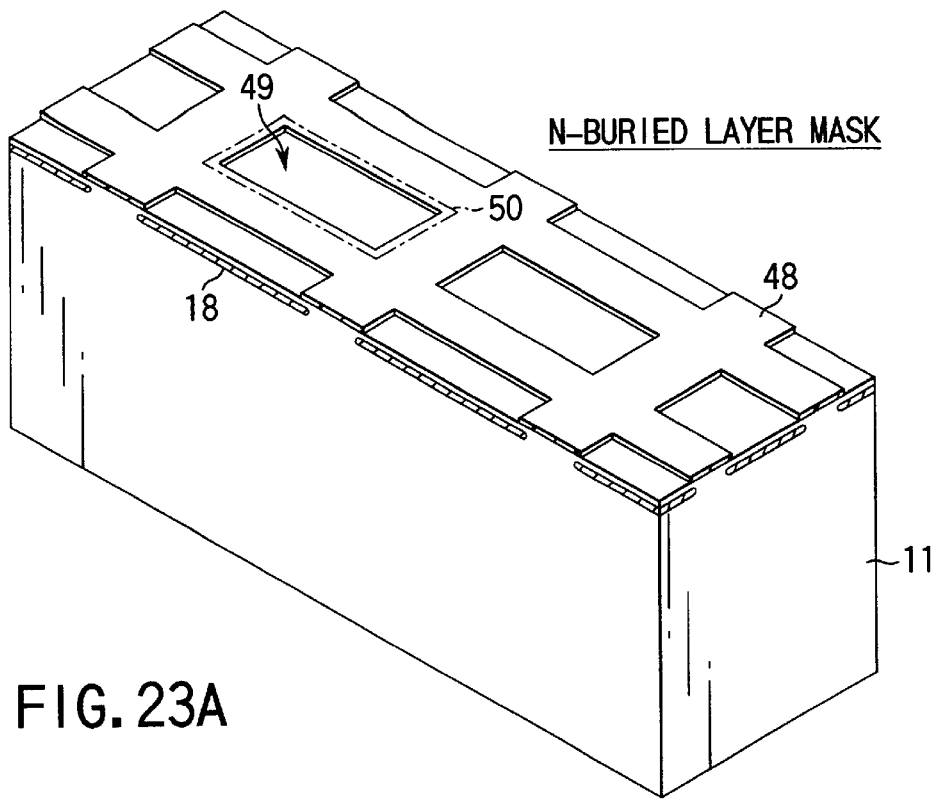
FIGS. 23A and 23B are perspective views respectively showing the whole memory cell array during the manufacturing process.
Figure 23B:
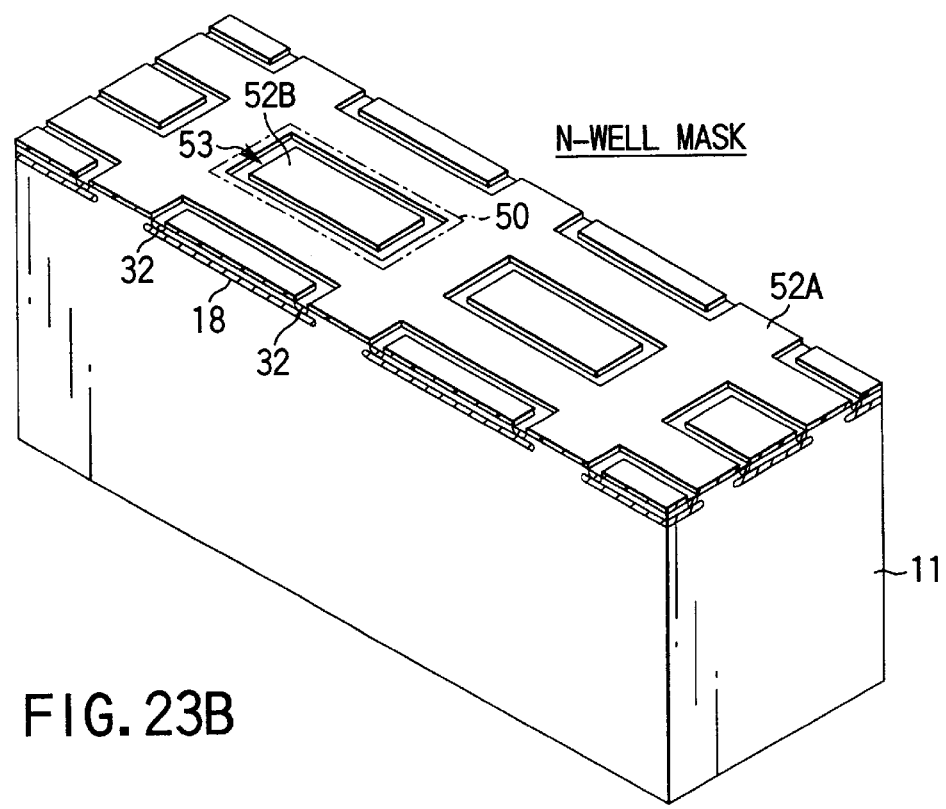
Figure 24:
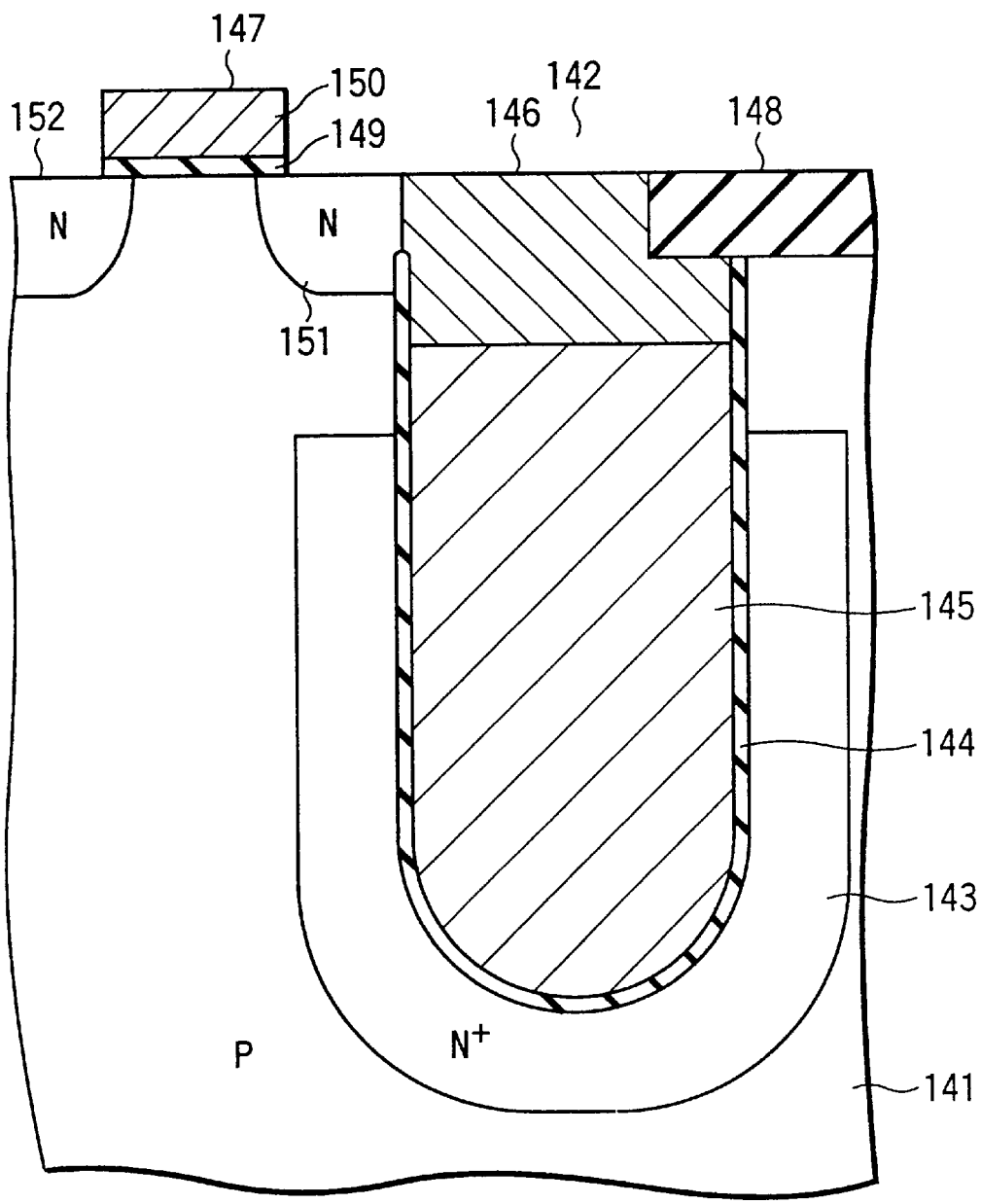
FIG. 24 is a sectional view of a conventional dynamic memory cell.
Figure 25A:
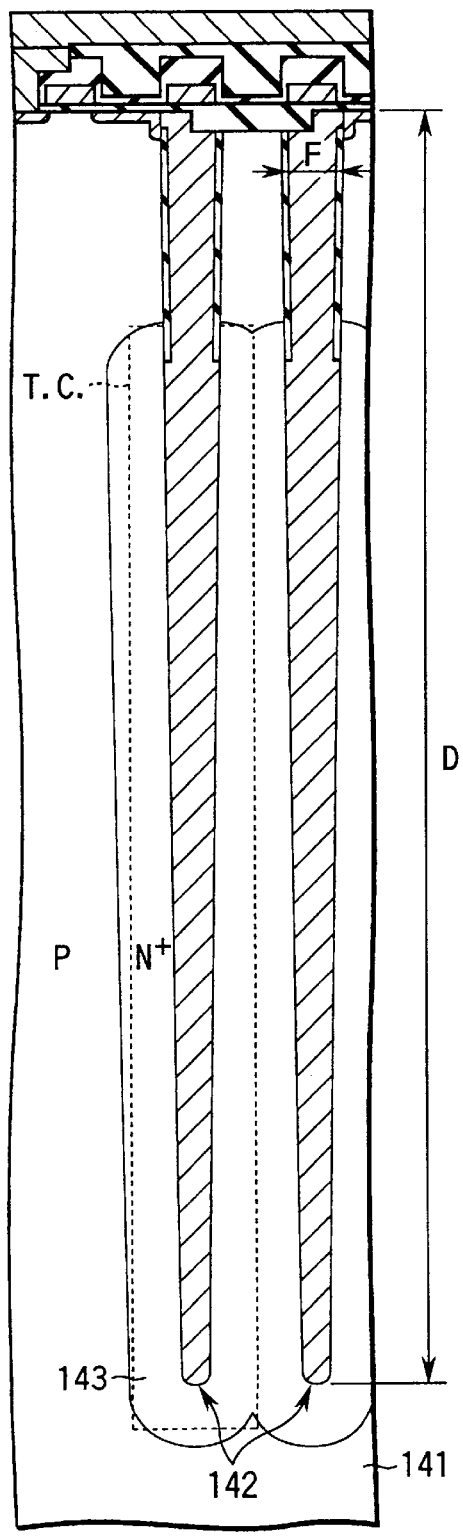
FIG. 25A is a sectional view of the conventional dynamic memory cell at an aspect ratio of about 20.
Figure 25B:
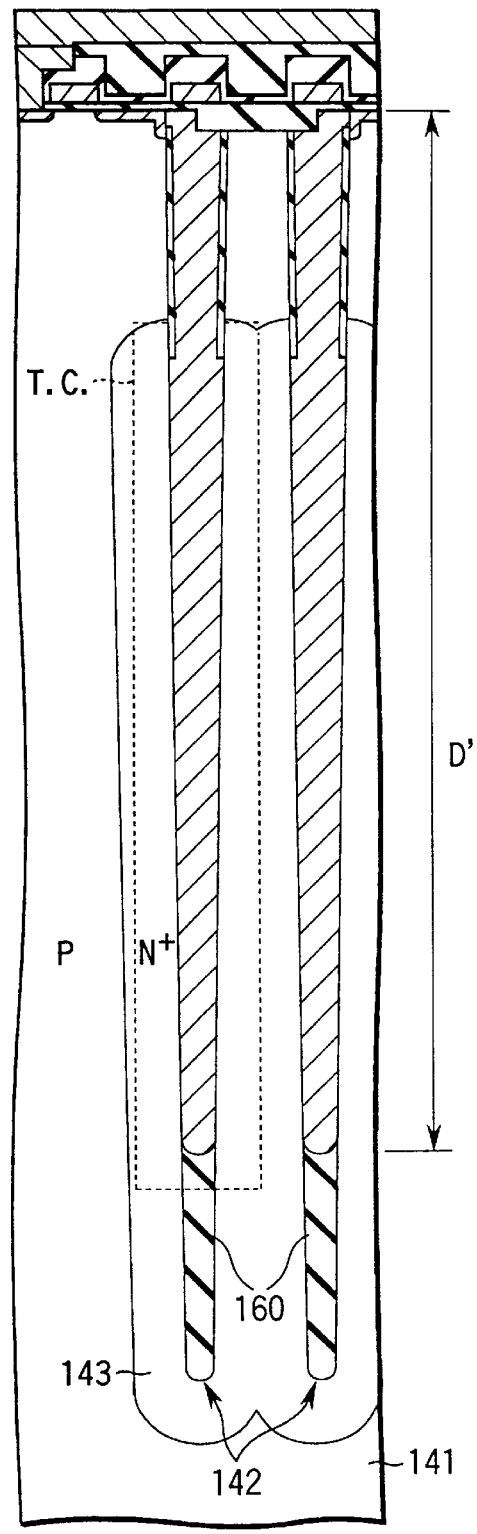
FIG. 25B is a sectional view showing the state wherein a solid phase diffusion source film is left at the bottom of a trench.

FIGS. 23A and 23B are perspective views respectively showing the whole memory cell array (64 kbit segment) during the manufacturing process.

As shown in FIG. 23A, windows 49 corresponding to a formation pattern for the n-buried layer 18 are formed in a photoresist film 48. Each window 49 corresponds to a memory cell array (64 kbit segment). A frame 50 of a chain double-dashed line shown in FIG. 23 indicates a portion where the memory cell array (64 kbit segment) is formed. In this step, the STI 17 or the trench 12 is used as an alignment mark. The n-buried layer 18 formed is aligned with the trench 12 at a high precision. An n-impurity for forming the n-buried layer 18 is ion-implanted in the substrate 11 using the photoresist film 48 as a mask. The n-impurity is, e.g, phosphorous ions. The phosphorous ions are implanted at a proper dose and a proper acceleration voltage described with reference to FIGS. 10 and 11.

At this time, ions may be prevented from being implanted in the trench 12 by masking the upper portion of the trench 12.

An n- or p-impurity for adjusting the threshold voltage is ion-implanted using the photoresist film 48 as a mask. Which of conductive p- and n-impurities is ion-implanted is determined by the relationship between the impurity concentration of the substrate 11 and the threshold voltage of the transfer transistor. A dotted line 51 shown in FIG. 22K indicates a portion where the conductive impurity for adjusting the threshold voltage is doped.

As shown in FIG. 22K, the structural feature when the n-impurity for forming the n-buried layer 18 is doped after the STI 17 is formed is that the depth of the n-buried layer 18 below the STI 17 is different from the depth below the active region 47. More specifically, the n-buried layer 18 below the active region 47 is deeper, whereas the n-buried layer 18 below the STI 17 is shallower.

As shown in FIG. 23B, after the photoresist film 48 is removed, a photoresist is applied again to form a photoresist film. Windows 53 corresponding to a formation pattern for wells 32 are formed in the photoresist film by photolithography. Since each window 53 has a ring-like shape, the photoresist film is shaped into a matrix-like portion 52A and individual island-like portions 52B. The matrix-like portion 52A covers a portion where a sense amplifier (S/A) and a word line driver (WDRV) are formed. Each island-like portion 52B covers a portion where a dynamic memory cell is formed. In this step, the STI 17 or the trench 12 is used as an alignment mark. The formed well 32 is aligned with the trench 12 at a high precision, and consequently, aligned with the n-buried layer 18 at a high precision. An n-impurity for forming the well 32 is ion-implanted in the substrate 11 using the photoresist films 52A and 52B as a mask. The n-impurity is, e.g., phosphorous ions.

By the steps shown in FIGS. 22K and 23A, the n-buried layer 18 is completed. By the step shown in FIG. 23B, the well 32 for leading the n-buried layer 18 to the surface of the substrate 11 is completed. The manufacturing method also includes the step of forming an n-well (not shown) and the like for forming a p-channel MOS transistor. This step may be performed at the same time as, before, or after the step of forming the well 32.

The flow shifts to a manufacturing sequence of forming a transistor and a manufacturing sequence of an internal wiring layer. These manufacturing sequences may be performed in accordance with a well-known manufacturing method. Subsequently, a concrete example of the manufacturing method up to formation of a bit line will be explained.

As shown in FIG. 22L, the buffer oxide film 41 is removed to expose the surface of the substrate 11 in the active region 47. The exposed surface of the substrate 11 is thermally oxidized to form a gate oxide film ($SiO_2$) 21. Conductive polysilicon is deposited on the obtained structure to form a conductive polysilicon film. Silicon nitride is deposited on the conductive polysilicon film to form a silicon nitride film 61. The silicon nitride film 61 and a conductive polysilicon film are patterned by photolithography. As a result, a word line 22 is formed. The silicon nitride film 61 formed on the upper surface of the word line 22 serves as a stopper used in forming a bit line contact hole by a self-aligned contact technique. An n-impurity for forming source and drain regions is ion-implanted in the substrate 11 using the silicon nitride film 61 and the STI 17 as a mask, thereby forming source and drain regions 19 and 20. Silicon nitride is deposited on the obtained structure to form a silicon nitride film 62. The silicon nitride film 62 formed on the side surface of the word line 22 functions to suppress short-circuiting between a conductor buried in a bit line contact hole and the word line 22.

As shown in FIG. 22M, silicon oxide is deposited on the structure shown in FIG. 22L to form a first interlevel insulating film 63. A bit line contact hole 64 is formed in the silicon nitride film 62 to reach the drain region 20. Tungsten 66 is buried in the bit line contact hole 64.

As shown in FIG. 22N, silicon oxide is deposited on the structure shown in FIG. 22M to form a second interlevel insulating film 67. A groove 68 corresponding to a bit line formation pattern is formed in the second interlevel insulating film 67. The groove 68 is buried with, e.g., tungsten 66 to planarize the surface of the resultant structure, thereby forming a bit line 23.

By the above method, the dynamic memory cell according to the present invention is completed.

Note that in the above manufacturing method, if the annealing step of activating the n-buried layer 18, the source region 19, the drain region 20, and the like is performed at the end of the manufacturing process, the n-buried layer 18 can be prevented from widening in the direction of depth, compared to the case wherein the n-buried layer 18 is formed at the start of the manufacturing process. Accordingly, the sheet resistance of the n-buried layer 18 can be satisfactorily decreased.

As has been described above, according to the present invention, a semiconductor integrated circuit device capable of maintaining a sufficiently large capacitance value of a capacitor element even for a high integration degree, and a method of manufacturing the same can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:

a semiconductor substrate of a first conductivity type;

a buried layer of a second conductivity type formed in said semiconductor substrate, said buried layer being spaced apart from a surface of said semiconductor substrate to divide said semiconductor substrate into an upper region and a lower region;

a trench formed from the surface of said semiconductor substrate to the lower region through said buried layer;

an electrode formed in said trench, said electrode being capacitively coupled to the lower region;

a switch connected to said electrode;

a circuit wiring layer connected to said switch; and a semiconductor region of the first conductivity type formed at a portion around said trench in the lower region, the first conductivity type of said semiconductor region having a dose lower than a dose of the first conductivity type of the lower region of said semiconductor substrate.

2. A device according to claim 1, wherein said electrode forms an inversion layer of the second conductivity type in the lower region by a field effect, and said inversion layer constitutes a capacitor element together with said electrode.

3. A device according to claim 2, wherein said buried layer functions as a source for carriers forming said inversion layer.

4. A device according to claim 3, wherein said buried layer is a diffusion layer containing an impurity of the second conductivity type, and said diffusion layer has a sheet resistance of not more than 1,500 ($\Omega$/sq).

5. A device according to claim 3, wherein said buried layer has a width in a direction of depth, and a distance from an upper surface of said buried layer to the surface of said semiconductor substrate is not less than 0.5 $\mu$m.

6. A device according to claim 3, wherein said buried layer receives a plate potential.

7. A device according to claim 6, wherein the plate potential is not more than the lowest potential of said circuit wiring layer.

8. A device according to claim 7, wherein the lowest potential is a potential of a driving signal for driving an nMOS sense amplifier connected to said circuit wiring layer.

9. A device according to claim 6, wherein the plate potential is substantially equal to a precharge level of said circuit wiring layer.

10. A device according to claim 9, wherein the precharge level is a precharge potential supplied to an equalizer connected to said circuit wiring layer.

11. A device according to claim 6, wherein a potential of the lower region is not more than a precharge level of said circuit wiring layer and not more than the plate potential.

12. A device according to claim 11, wherein the plate potential is substantially equal to a precharge level of said circuit wiring layer.

13. A device according to claim 12, wherein the precharge level is a precharge potential supplied to an equalizer connected to said circuit wiring layer.

14. A device according to claim 3, wherein a potential of the upper region is not more than a potential of the lower region.

15. A device according to claim 14, wherein said switch is an insulated gate FET using the upper region as a backgate region.

16. A device according to claim 1, wherein the first conductivity type of the semiconductor region of the first conductivity type has a concentration lower than the first conductivity type of the lower region.

* * * * *